(12) United States Patent
Gray

(10) Patent No.: US 11,455,171 B2
(45) Date of Patent: Sep. 27, 2022

(54) MULTIPORTED PARITY SCOREBOARD CIRCUIT

(71) Applicant: Gray Research LLC, Bellevue, WA (US)

(72) Inventor: Jan Stephen Gray, Bellevue, WA (US)

(73) Assignee: Gray Research LLC, Bellevue, WA (US)

( * ) Notice: Subject to any disclaimer, the term of this patent is extended or adjusted under 35 U.S.C. 154(b) by 0 days.

(21) Appl. No.: 16/888,604

(22) Filed: May 29, 2020

(65) Prior Publication Data

US 2021/0117201 A1     Apr. 22, 2021

Related U.S. Application Data

(60) Provisional application No. 62/854,243, filed on May 29, 2019.

(51) Int. Cl.
*G06F 9/38* (2018.01)
*G06F 1/10* (2006.01)
(Continued)

(52) U.S. Cl.
CPC .............. *G06F 9/3838* (2013.01); *G06F 1/10* (2013.01); *G06F 9/30029* (2013.01);
(Continued)

(58) Field of Classification Search
CPC .............. G06F 9/30101; G06F 15/8053; G06F 9/30036; G06F 9/30043; G06F 9/34;
(Continued)

(56) References Cited

U.S. PATENT DOCUMENTS 5,175,862 A * 12/1992 Phelps ...................... G06F 7/00
                                                                712/7
6,408,378 B1 * 6/2002 O'Connor ............. G06F 9/3838
                                                                712/216
(Continued)

OTHER PUBLICATIONS

Laforest et al., "Efficient Multi-Ported Memories for FPGAs", A thesis submitted in conformity with the requirements for the degree of Master of Applied Science, Graduate Department of Electrical and Computer Engineering, 2009, pp. 1 through 54, University of Toronto.
(Continued)

*Primary Examiner* — Shawn Doman
(74) *Attorney, Agent, or Firm* — Fogg & Powers LLC

(57) ABSTRACT

A fast and frugal item-state tracking scoreboard circuit is disclosed. The scoreboard maintains per-item partial states across multiple memory circuits, enabling multiple lookups per clock cycle and multiple state updates per clock cycle. In an embodiment a scoreboard is used to schedule instructions in an out-of-order processor. Each clock cycle the scoreboard indicates the busy state of an instruction's registers and may update the busy state of the destination registers of issuing instructions and completing instructions. Applications include register tracking, function-unit tracking, and cache-line state tracking, in embodiments including processor cores (including superscalar, superpipelined, and multithreaded processors), accelerators, memory systems, and networks. In an embodiment, a register-busy scoreboard circuit is implemented using FPGA LUT RAM memory. In an embodiment, a three-read/two-write per cycle register file scoreboard of 64 registers uses 16 LUTs and indicates whether an instruction is issuable in two LUT delays.

21 Claims, 13 Drawing Sheets

(51) Int. Cl.
  *G06F 9/30* (2018.01)
  *G06F 16/901* (2019.01)
  *G06F 30/34* (2020.01)

(52) U.S. Cl.
  CPC ........ *G06F 9/30098* (2013.01); *G06F 9/3816* (2013.01); *G06F 9/3836* (2013.01); *G06F 9/3851* (2013.01); *G06F 16/9017* (2019.01); *G06F 30/34* (2020.01)

(58) Field of Classification Search
  CPC .............. G06F 9/3824; G06F 9/30018; G06F 9/30021; G06F 9/30032
  USPC .............................. 712/220, 224, 225, 226
  See application file for complete search history.

(56) References Cited

U.S. PATENT DOCUMENTS

| | | | | |
|---|---|---|---|---|
| 6,715,060 B1* | 3/2004 | Arnold | ................. | G06F 9/3836 712/217 |
| 6,810,474 B1* | 10/2004 | Miki | .................. | G06F 9/30072 712/213 |
| 6,976,152 B2* | 12/2005 | Yeh | ...................... | G06F 9/3836 712/217 |
| 8,214,624 B2* | 7/2012 | Berglas | ................ | G06F 9/3836 712/216 |
| 2003/0033511 A1* | 2/2003 | Akkary | ................ | G06F 9/3855 712/235 |
| 2005/0071518 A1* | 3/2005 | Samra | ................. | G06F 9/30094 710/1 |
| 2007/0050602 A1* | 3/2007 | Lien | ........................ | G06F 9/384 712/217 |
| 2007/0083736 A1* | 4/2007 | Baktha | .................. | G06F 9/3857 712/215 |
| 2009/0150653 A1* | 6/2009 | Monferrer | ............... | G06F 9/321 712/217 |
| 2010/0268919 A1* | 10/2010 | Chaudhry | ........... | G06F 9/30112 712/210 |
| 2010/0306509 A1* | 12/2010 | Day | ..................... | G06F 9/3838 712/217 |
| 2011/0099355 A1* | 4/2011 | Tran | ........................ | G06F 1/324 712/217 |
| 2012/0284570 A1* | 11/2012 | Gilani | .................. | G06F 9/3861 714/49 |
| 2018/0032344 A1* | 2/2018 | Smith | ................... | G06F 9/3834 |
| 2019/0155648 A1* | 5/2019 | Knowles | .............. | G06F 9/4887 |
| 2019/0188596 A1* | 6/2019 | Ipek | ...................... | H01L 39/223 |
| 2020/0089503 A1* | 3/2020 | Gupta | .................. | G06F 9/3857 |
| 2020/0117811 A1* | 4/2020 | Ghosh | ................. | G06F 9/30007 |

OTHER PUBLICATIONS

Laforest et al., "Efficient Multi-Ported Memories for FPGAs", FPGA'10, Feb. 2010, pp. 41 through 50, Monterey, California.
Laforest et al., "Multi-Ported Memories for FPGAs via XOR", FPGA'12, Feb. 2012, pp. 1 through 10, Monterey, California.

* cited by examiner

MULTIPORTED PARITY SCOREBOARD CIRCUIT

CROSS REFERENCE TO RELATED APPLICATION

This application claims benefit of U.S. Provisional Patent Application No. 62/854,243 filed on May 29, 2019 and entitled "MULTIPORTED PARITY SCOREBOARD, AND APPLICATIONS," the contents of which are incorporated herein in their entirety.

TECHNICAL FIELD

The present disclosure relates generally to electronic circuits, and relates more specifically to, e.g., computer architecture, processor design and implementation, processor microarchitecture, out-of-order instruction scheduling and execution, pipelined, superpipelined, superscalar, and multithreaded execution, field-programmable-gate-array (FPGA) circuit design and implementation, instruction and memory latency tolerance, integration of custom instructions, function units, and accelerators, and electronic design-automation tools.

DESCRIPTION OF THE RELATED ART

The present disclosure pertains to the design and implementation of high-performance microprocessors, also called "processors" herein. A processor executes instructions. Under the covers, at the microarchitecture level, the processor may perform instructions piecewise concurrently and/or in different time steps or orders, so long as (from the perspective of the software) instructions appear to execute one after another.

A processor includes a register file of one or more logical registers (here named "x0," "x1," "x2," and so on). A register may hold a value (typically a 32-bit or 64-bit word.) An instruction, such as add x3, x1,x2 (i.e. read registers x1 and x2, add them together, and write the sum to register x3) reads source registers (here x1 and x2) and writes destination registers (here x3).

At the microarchitecture level, instruction execution includes steps such as instruction fetch, instruction decode, decoded-instruction execute, and result writeback. A simple processor architecture sequentially performs these steps for the first instruction, then for the second, and so forth. A processor may employ pipelining, analogous to a factory assembly line, to overlap execution of the steps and thus run the software program in less time than the processor would take to execute the software-program instructions sequentially without pipelining. Each step of instruction execution (e.g., performing an instruction) is called, herein, a pipeline stage. So in a given clock cycle, running a program including the instruction sequence I1, I2, I3, I4, the processor may be writing back to a register in the register file any results of instruction I1, executing decoded I2, decoding I3, and fetching I4. That is, during the time window of this given clock cycle, I4 is in the instruction fetch ("IF") stage, I3 is in the decode ("DC") stage, I2 is in the execute ("EX") stage, and I1 in the writeback ("WB") stage. In some embodiments an instruction pipeline may have fewer stages, in others, more stages.

Ideally, this simple ("scalar") pipelined execution proceeds at the rate of one instruction pipeline stage per clock cycle. However, some time-consuming ("long latency") instruction operations can temporarily stall the steady flow of the pipeline until they complete. For example, some operations, such as integer divide, are inherently slower in digital logic than simpler operations like integer add, and, therefore, may take several clock cycles. Other operations, such as load from memory, may take several clock cycles to convey the memory-read-request operation to memory or to a data cache, perform access checks, and convey the memory-read-result data back to the processor.

When long-latency operations cause a pipeline stall, instruction execution stalls, and so performance (expressed as instructions per cycle or instructions per second) suffers. But it is often the case that the destination register of the long-latency instruction is not immediately used as a source register of a subsequent instruction. Consider these two assembly code sequences:
I0: ld x1,0(x2)
I1: add x3,x4,x5
I2: add x6,x7,x8
I3: add x9,x10,x1
vs.
I10: ld x1,0(x2)
I11: add x9,x10,x1
I12: add x3,x4,x5
I13: add x6,x7,x8

In the first sequence I0 . . . I3, I0 loads a value from memory into x1. x1 is not used as a source register until I3, three instructions later. In the second sequence, I10 loads a value from memory into x1, but then this new value of x1 is immediately used as a source register of the next instruction, I11. Here I0's load takes three cycles, but that value isn't used for three cycles, so the pipeline might proceed without stalling, issuing I1 and I2 (which neither read x1 nor write x1) as the load progresses, overlapping the I1 and I2 operations with the load operation underway. In this schedule, instructions issue in order I0, I1, I2, I3, but complete out of order (here load I0 completes, and writes back its results, after add instruction I1 does).

Conversely, this approach does not apply for the I10 . . . I13 sequence. If I11 were to issue before I10's load into x1 completes, I11's add might operate on some old value of x1 instead of the load result. Here I1 1 should await the load result arriving in register x1—the pipeline should stall for two cycles.

To distinguish the two cases and to allow instructions to issue in-order ("in-order issue") but sometimes complete out-of-order ("out-of-order completion"), a processor may employ a busy-register scoreboard (herein, "scoreboard"). In an embodiment, a scoreboard tracks which registers are busy because they are the destination register of an instruction operation which has not yet completed. In an embodiment, a scoreboard is a general structure used to associate some respective state with each of some items. In an embodiment, the scoreboard associates a respective busy bit with each register of a processor register file. Alternatively, one could say that the scoreboard circuit associates a respective not-busy bit with each register. Other terms for "busy" include, but are not limited to, "in-progress," "invalid," "issued-but-not-completed," "not-ready," and other terms for "not-busy" include, but are not limited to, "ready," "valid," "present," and "available."

In an embodiment, after an instruction is decoded but before it issues to the execute stage, the instruction scheduler, a component of the processor's overall pipeline controller, determines whether the instruction can issue (begin execution) in the current clock cycle. In an embodiment, in a processor with in-order issue and out-of-order completion, the instruction scheduler uses the busy-register scoreboard to determine whether the instruction's source register(s) is/are busy and whether the instruction's destination register(s) is/are busy. If no source register nor destination register is busy, it is safe and correct for the processor to issue the current instruction to the execute pipeline stage. If a source register is busy because it is the destination register of some prior instruction operation which has not yet completed, the present instruction exhibits a RAW (read after write) dependency hazard, and the pipeline stalls awaiting completion of the prior operation. If the destination register is busy (again because it is the destination register of some prior instruction operation which has not yet completed), the present instruction exhibits a WAW (write after write) dependency hazard. Here too the pipeline stalls lest the present instruction complete and write to the destination, only for that result to be erroneously overwritten by the prior instruction-operation result when it finally completes.

SUMMARY

A scoreboard is a general circuit structure or topology used to associate some respective state with each of some items, and to update and retrieve items' states as they change over time.

One aspect described in the present disclosure is an apparatus and method to implement small, fast, highly multiported scoreboard circuits. In an embodiment, the apparatus includes a plurality of memories, each keeping partial state information, i.e. shards or aspects of the overall true state of each of a plurality of items. The state of an item may be determined by reading from the various memories all the partial state entries for the item and combining them under, or otherwise according to, some function. The states of various items may be updated concurrently by concurrently writing the separate partial state updates into the various memories. In an embodiment, w concurrent writers of partial state information use w separate one-write-per-cycle memories. In another embodiment, w concurrent writers of partial state information use ceiling(w/k) k-write-per-cycle memories. Another aspect described in the present disclosure uses multiple copies (replicas) of the sets of memories to enable multiple concurrent read accesses to the scoreboard-item state. A first reader reads all the partial state for a first item from the first set of memories, and combines them to determine the first item's state; a second reader reads all the partial state for a second item from the second set of memories, and combines them to determine the second item's state; and so on.

In an embodiment, instead of keeping c copies of the sets of memories, ceiling(c/k) sets of k-read-1-write/cycle memories hold the replicated partial-state entries to facilitate k reads of all the partial state information per cycle. In an embodiment, a 3-read, 2-write scoreboard stores partial-state entries across two 3-read-1-write/cycle memories.

In an embodiment, a busy-register scoreboard associates a busy state with each register in a processor register file. In an embodiment, a busy state is a one-bit quantity: 0 means the register is idle, 1 means the register is busy. In an embodiment, a first scoreboard writer may toggle a first register's entry in a first memory from 0 to 1, or from 1 to 0, indicating an operation has begun and the first register has become busy; at the same time, a second writer may toggle a second register's entry in a second memory, from 0 to 1, or from 1 to 0, indicating an operation has completed and the second register has become idle (unbusy). At the same time a first reader can read the partial-state-information entry for a register (which may be the first or second register, or a third register that an instruction specifies) from the first and second memory circuits, and take the Boolean exclusive-or (XOR) of the entries, to recover the true 'busy' state of the register. Assuming that the initial state of the first and second memories is 0, 0 or 1, 1, if the two entries are 0,0, or 1,1, the register is presently (during the present clock cycle) idle. Alternatively, if the two entries are 0, 1 or 1,0, the register is presently busy.

In an embodiment, the busy-register scoreboard has three read ports. That is, each cycle, the instruction scheduler uses the scoreboard to determine whether any of a first source register, a second source register, and a destination register of an instruction are busy.

In an embodiment, the busy-register scoreboard has one write port. That is, each cycle, the instruction scheduler may update the scoreboard to reflect that either it has issued a long-latency operation that will write some destination register, or it has just completed a long-latency operation that has written some destination register.

In another embodiment, the busy-register scoreboard has two write ports. That is, each cycle, the instruction scheduler may update the scoreboard to indicate that it has issued an operation that will write some destination register, and it may update the scoreboard to indicate that it has just completed an operation that has written some destination register.

An embodiment of a busy-register scoreboard with three read ports and two write ports will typically exhibit higher performance (instructions per clock) than one with three read ports and one write port, because in a one-write-port-scoreboard design, when the processor instruction pipeline issues a long-latency-instruction operation just as some prior long-latency-instruction operation completes, it may take two clock cycles to update these two busy conditions in the scoreboard.

A fast and resource-efficient multiported scoreboard can be the linchpin of a high-performance processor, i.e., a processor with a high-clock-frequency operation and a high number of instructions executed per clock cycle, a processor that is tolerant of multi-cycle-function-unit latencies and memory-access latencies and/or that supports out-of-order instruction execution or completion. But it can be challenging to implement a scoreboard that provides multiple read and multiple write operations per clock cycle and that is both compact (uses relatively few logic gates or FPGA lookup tables (LUTs)) and fast (incurs few gate delays or FPGA LUT delays, thus enabling a relatively high-frequency operation).

To appreciate the utility and one or more advantages of embodiments such as those described in the present disclosure, consider the following various ways to implement a busy-register scoreboard.

In an embodiment, a busy-register-scoreboard implementation might use one flip-flop to represent the busy state for one register. Therefore, an n-entry register file uses n flip-flops. So checking whether any of up to m registers are busy in a given cycle uses m n-input multiplexers (indexed by source or destination register number), i.e. m read ports across the "array" of flip-flops. In other words, that is m instances of n-bit multiplexers. In an embodiment, for a processor with a register file of 32 or 64 registers, this uses 32-to-1 or 64-to-1 multiplexers, which typically take three LUT delays in a 6-LUT FPGA.

Also, on a given cycle, if x instructions may issue (each busying its destination register) and y instructions may complete (each un-busying its destination register), then w=x+y writes may update various flip-flops in the scoreboard each cycle. This incurs O(n×w) write-enable-decode subcircuits. This can be relatively large and slow in an FPGA, particularly as FPGAs have control-set restrictions, in which all the flip-flops within a logic cluster such as a Xilinx CLB share a common clock enable signal.

In another embodiment, a busy-register-scoreboard implementation might use a small static RAM (SRAM) memory. In an embodiment, each entry in the memory is a one-bit busy value. Then issuing an instruction sets its destination register's busy bit in the memory, and subsequently completing ("retiring") an instruction clears (e.g., zeroes) its destination register's busy bit. If, as is usually the case, the memory supports up to one write per clock cycle, it will take two cycles to set and later clear the register's busy bit. This limits processor performance to a maximum of one instruction per two cycles.

In another embodiment, the scoreboard's memory is double pumped. That is, the processor pipeline operates from a clock with some frequency f and the scoreboard memory operates from a "clk2x" clock at frequency 2f. This allows two write accesses to the memory per pipeline clock cycle. However, this constrains the maximum clock frequency of the processor pipeline to half the maximum frequency of SRAM write cycles. Furthermore, in an embodiment of a superscalar processor capable of issuing two instructions per cycle and retiring (completing) two instructions per cycle, the processor could perform up to four updates to the busy-register-scoreboard memory per cycle, potentially capping the maximum clock frequency of the processor pipeline to one fourth of the maximum frequency of SRAM write cycles.

In contrast, an embodiment provides r scoreboard-read accesses per clock cycle, and w scoreboard-write accesses per clock cycle. Instead of n flip-flops, the scoreboard circuitry includes a few small SRAM memories. In an embodiment implemented in FPGAs, the scoreboard keeps partial busy-state information in 1-read/1-write/cycle LUT-RAM memories. In another embodiment implemented in FPGAs, the scoreboard keeps partial busy-state information in k-read/1-write/cycle LUT-RAM memory. In yet another embodiment, the scoreboard keeps partial busy-state information in FPGA block BRAM memories. In keeping the state in a memory instead of flip-flops, the scoreboard leverages RAM structures' built-in write decoders and output multiplexers, delivering typically greater than 16x density vs. so many flop-flops, and retrieving busy-state readouts in two LUT delays (one for the LUT-RAM, one for the ready-state logic) versus at least three LUT delays for a many-flip-flops approach. And in keeping the scoreboard circuit simple and compact, the number and lengths of FPGA programmable interconnect wires is reduced, simplifying routing and reducing interconnect delays, which may be significantly larger than LUT delays.

Unlike other approaches, in an embodiment, using one partial-state memory per write access per cycle, an embodiment described in the present disclosure enables several scoreboard-state updates per cycle, at frequencies approaching FPGA LUT-RAM write-cycle-time maximum frequency.

The present disclosure, in an embodiment, describes an implementation of a three-read, two-write-per-cycle scoreboard, including "instruction ready logic," for 64 registers, in just six 1-read/1-write/cycle RAM64x1D 64b LUT-RAMs and four 6-LUTs, or 16 LUTs in all. The latency to check that none of an instruction's three specified registers are busy is two LUT delays. Both the resource use and LUT delay are suitable for this scenario and a Xilinx FPGA architecture.

In an embodiment, a busy-register scoreboard that supports w updates per cycle keeps partial-busy-state entries for registers across w memories, and the busy state of a register is the Boolean exclusive-or (XOR) reduction across these partial-busy-state values. In an embodiment, a register is busy if the XOR of the partial states equals 1. This is equivalent to computing the parity of the partial busy state values—in an embodiment, a register is busy if its partial-busy-state entries have odd parity.

An embodiment is an implementation of a six-read, four-write-per-cycle scoreboard, suitable for a two-issue, two-retire-per-cycle superscalar processor, including "instruction-ready logic" for two instructions, for a machine with 64 registers, in just four 7-read/1-write/cycle RAM64M8 64b LUT-RAMs and eight 6-LUTs, or 40 6-LUTs in all.

Embodiments of the present disclosure may include one or more of these features:

1) A scoreboard keeping item state in a memory.
2) A scoreboard keeping item state as partial-item states stored across a plurality of memories.
3) A scoreboard that retrieves item state by reading the item's partial-item-state entries across a plurality of memories and by combining said partial item states into an item state by means of a function or algorithm.
4) A scoreboard memory with a partial item state of one bit.
5) A scoreboard memory with a partial item state of one bit wherein a writer updates a partial-item-state entry by toggling the partial-item-state entry.
6) A scoreboard memory with a partial item state of one bit wherein a writer updates a partial-item-state entry by toggling the entry or by initializing the entry to a constant value.
7) A circuit to initialize all partial-item-state entries across all scoreboard memories by means of iteratively writing all entries with one or more constant values.
8) A scoreboard memory with a partial item state as an n-bit version number.
9) A scoreboard memory with a partial item state as an n-bit version number wherein a writer updates a partial-item-state entry by incrementing the entry.
10) A scoreboard memory with a partial item state as an n-bit version number wherein a writer updates a partial-item-state entry by writing an arbitrary n-bit value.
11) A scoreboard memory implemented in an ASIC SRAM.
12) A scoreboard memory implemented in an FPGA LUT-RAM (e.g., Xilinx RAM32X1D), FPGA LUT-RAM complex (e.g., Xilinx RAM64M8, RAM32M16, Intel MLAB, etc.), or FPGA block RAM (e.g., Xilinx RAMB36E2).
13) A scoreboard configured to use a Boolean function across two or more partial item states to determine item state.
14) A scoreboard configured to use exclusive-or (XOR) reduction across partial item states to determine item state.
15) A scoreboard configured to use equality reduction across partial item states to determine item state.
16) A scoreboard configured to use add reduction across partial item states to determine item state.

17) A scoreboard configured to use maximum or minimum reduction across partial item states to determine item state.
18) A scoreboard configured for use as a busy-register scoreboard.
19) A busy-register scoreboard with a read port for each source or destination register of one or more program instructions to issue.
20) A busy-register scoreboard with a write port for each destination register to issue and for each destination register to retire.
21) A scoreboard configured for use as a busy-function-unit scoreboard.
22) A scoreboard configured for use as a valid-state-per-line-in-a-cache scoreboard.
23) A scoreboard configured for use as a miss-in-progress-state-per-line-in-a-cache scoreboard.
24) A scoreboard configured for use as a credit-per-buffer-entry scoreboard or a credit-per-remote-load/store-queue-entry scoreboard in a system.
25) A scoreboard configured for use as an empty/full-state-per-slot scoreboard in a multi-slot mailbox.
26) A scoreboard configured for supporting multiple writes per cycle by means of each writer writing to a different partial-item-state entry in a different memory of the scoreboard.
27) Including a busy-register scoreboard for instruction scheduling in a scalar processor, a LIW (long-instruction-word) processor, a pipelined processor, a super-pipelined processor (in which the latency of the processor ALU is greater than one cycle), a superscalar processor, a superpipelined superscalar processor, a multithreaded processor, a superpipelined multithreaded processor, or a superpipelined superscalar multithreaded processor.
28) A busy-register scoreboard configured as a busy-integer-register scoreboard, a busy-floating-point-register scoreboard, or a busy-vector-register scoreboard.
29) An instruction scheduler configured to use a scoreboard to schedule long-latency or unknown-latency operations but configured to avoid use of a scoreboard for single-cycle-latency or fixed-cycle-latency operations.
30) Multiprocessors, systems, systems-on-chips, networks-on-chips, and other integrated circuits that incorporate processors or accelerators that incorporate one or more embodiments described in the present disclosure.
31) Tools that generate software and hardware description systems to implement embodiments, including soft-processor and soft-processor-array generators that configure or generate designs that can be instantiated as one or more embodiments.
32) Computer-readable media that store, or otherwise include, an FPGA configuration bitstream (e.g., firmware) to configure the FPGA to instantiate one or more embodiments.

DETAILED DESCRIPTION

Figure 1:
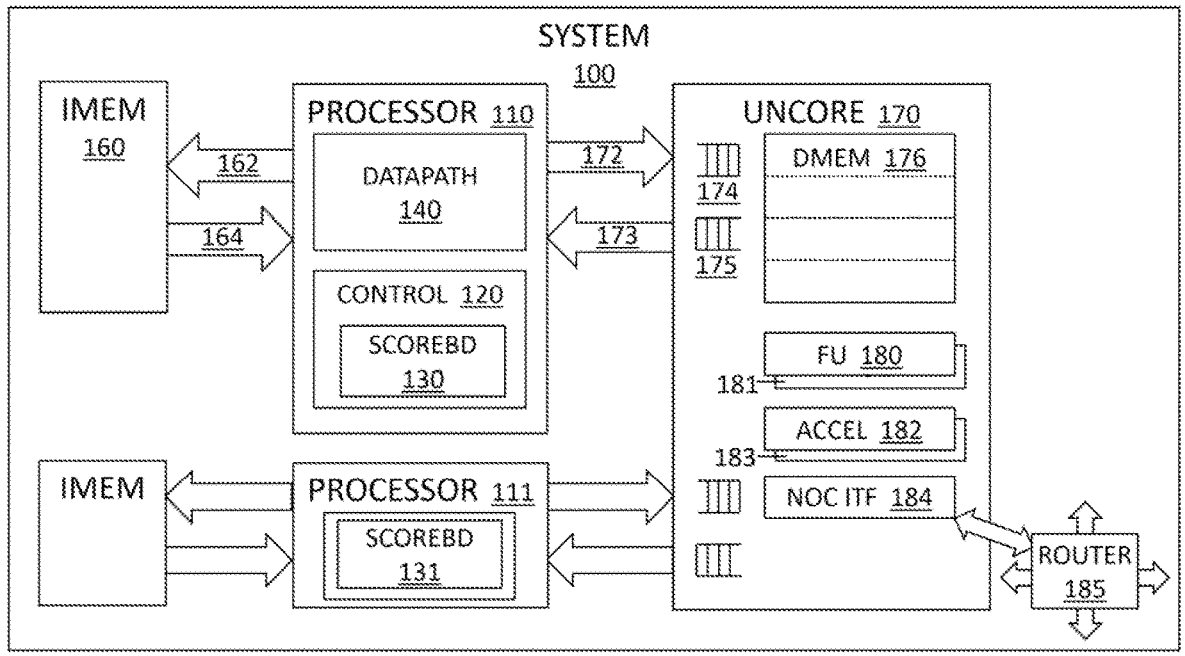
FIG. 1 is a block diagram of an integrated circuit of a system including two microprocessors each including a scoreboard circuit, according to an embodiment.

A system and method configured to implement small, fast, highly multiported scoreboard circuits, and applications of such scoreboard circuits in high-performance processors and systems is disclosed, according to an embodiment.
FIG. 1 is a block diagram of a system on an integrated circuit 100, according to an embodiment, the system including two processor circuits (e.g., microcontrollers, microprocessors) 110 and 111 including scoreboards 130 and 131, respectively.
The processor circuit 110 includes a control unit 120 having the scoreboard 130 and a datapath 140. The processor circuit 110 is coupled to instruction-memory circuit IMEM 160 by buses I_ADDR 162 and INSN 164. The processor circuit 110 issues instruction fetches by means of the instruction address and control bus I_ADDR 162 and receives fetched instructions on the instruction bus INSN 164.

The processor circuit 110 is coupled to an uncore circuit 170 by a request bus REQ 172 and a response bus RESP 173. Processor-circuit requests and responses may include memory accesses, input/output (I/O) access, and memory-mapped I/O accesses. Requests and responses may be single-cycle latency, fixed latency, or variable latency. Requests and responses may be pipelined and may take from several cycles to hundreds of cycles. Requests need not incur a response. A response need not be in response to a request. Responses may be returned in the same order as corresponding requests, or responses may be returned in some other order. Requests and responses may include a type, and a destination identifier, which may designate the destination register to receive the response. Requests may be queued in queue circuit 174 and responses may be queued in queue circuit 175. Uncore circuit 170 may include a data-memory circuit 176, which may have multiple banks, and which may be a data cache. The uncore 170 may further include one or more function circuits or function units 180 and 181. A function unit may be for the sole use of a specific processor circuit 110 or may be arbitrated for and shared amongst several processor circuits 110 and 111. The uncore 170 may further include one or more accelerator circuits 182 and 183. An accelerator circuit may be for the sole use of a specific processor 110 or may be arbitrated for and shared amongst several processors 110 and 111. An accelerator circuit may be fixed function, or programmable, it may have memory-mapped control/status registers, it may have a separate (master) memory-access-memory circuit including data memory 176. The uncore 170 may include a NoC (network on chip) interface 184. NOC interface 184 may be coupled to a NoC via a NoC router 185 or switch. The NoC router 185 may be coupled to other routers and to other uncore circuits, processor circuits, accelerator circuits, on-chip or off-chip memory circuits, networks, and interfaces.

The processor circuit 110 may use the scoreboard circuit 130 to implement a degree of latency tolerance and thereby improve performance. For example, the processor circuit 110 may issue an instruction operation that causes the processor circuit to perform a multi-cycle latency request of a unit in the uncore circuit 170, e.g. the instruction operation causes the processor circuit to perform a load from data memory DMEM 176, or e.g., to perform a divide operation using function unit FU 180, and that operation may take several cycles to traverse over bus REQ 172 and to be queued in the queue circuit 174, may take several cycles in the uncore resource 176 or 180, several cycles to return to the processing circuit 110 via response queue circuit 175 and response bus RESP 173. Rather than stalling the processor pipeline, the processor circuit 110 signals the scoreboard circuit 130 to update the instruction's destination register to the busy state. Then so long as subsequent instructions in the program execution do not specify a source or destination register that matches the destination register of the long-latency instruction in progress, processor circuit 110 may continue issuing and executing instructions and making progress. Conversely, if a subsequent instruction would cause the processor circuit 110 to access the busy destination register, processor 110 may stall awaiting the response on the bus RESP 173 from the uncore circuit 170 signaling that the long-latency operation is complete, waiting until the result has been written back to the destination register specified in the response and the busy destination register updated to the idle state in the scoreboard circuit 130.

Figure 2:
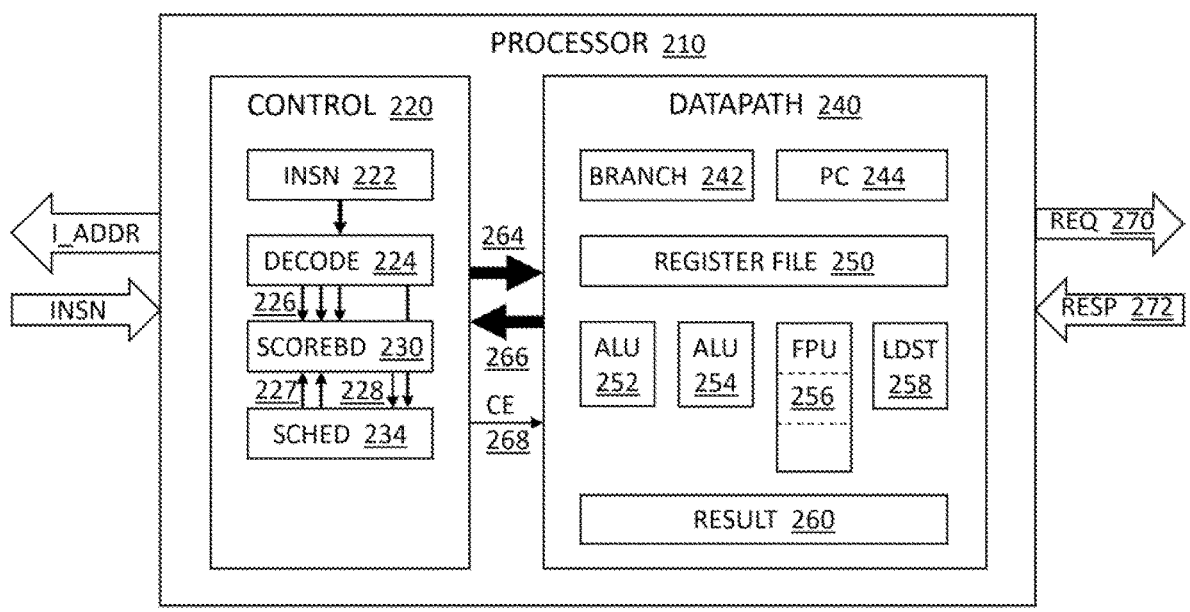
FIG. 2 is a block diagram of a processor including a scoreboard circuit, according to an embodiment.

FIG. 2 is a block diagram of a processor circuit 210, according to an embodiment, corresponding to processor circuit 110 in FIG. 1.

Processor circuit 210 includes control circuit or unit 220 and datapath circuit or unit 240, which are communicate with one another by control and status signals 264 and 266, and by datapath-pipeline-control signal 268.

Control unit 220 includes just-fetched-instruction register 222, instruction decoder circuit 224, scoreboard circuit 230, and instruction-scheduler-and-pipeline-control circuit or unit 234. The newly fetched, pending instruction in the register 222 is decoded by decoder circuit 224. Decoder circuit 224 extracts various register-number (register-identifier) fields 226 from the instruction and the values within these fields are coupled to scoreboard circuit 230. In case the instruction stored in the register 222 does not include, or otherwise use, the full set of register-number fields (i.e., some instructions have no source registers, or just one source register; some instructions have no destination register), the decoder circuit 224 specifies a distinguished register (e.g., x0), which is never written and, therefore, is never busy (so it acts as a "don't care" for the purposes of the instruction-scheduler circuit 234 determining whether any register used by the instruction 222 is busy.)

Scoreboard control signals 227 from instruction scheduler circuit 234 are also coupled to the scoreboard circuit 230. Each cycle, the scoreboard circuit 230 determines whether registers 226 from the current instruction 222 are busy; if none are busy, the scoreboard circuit asserts signal RDY 228 to the scheduler circuit 234.

In response to the scheduler circuit 234 issuing an instruction, the scheduler circuit may signal the scoreboard circuit 230 to update the partial-state entry for the destination register of the instruction to reflect that the destination register is now busy by means of scoreboard control signals 227, which enable the toggling of the destination register's partial-state entry.

In response to the scheduler circuit 234 determining that a long-latency operation has completed, for example, after receiving a completion response 272, the scheduler 234 may signal the scoreboard circuit 230 to update the partial-state entry for the destination register to reflect that the destination register is no longer busy, i.e., that the destination register is idle, by means of other scoreboard control signals 227, which enable the toggling of the completed instruction's destination register's partial-state entry.

In response to signal RDY 228 being asserted or negated, scheduler circuit 234 may also advance or stall the processor pipeline by asserting or negating pipeline clock enable CE 268. In an alternative embodiment, the control circuit 2202 does not stall the pipeline but rather the pipeline accepts a null (or annulled) instruction, so attributed that it has no output side effects, does not write to the register file, does not issue requests, etc.

Datapath 240 circuit may be configured to implement a pipelined-processor datapath. Datapath 240 circuit includes a program counter PC 244, program-counter and branch logic circuit 242, a register file 250, single-cycle integer arithmetic logic units (ALU)s 252 and 254, floating point circuit FPU 256 with several cycles of latency, a load/store circuit or unit LDST 258, and result-multiplexing-and-write-back logic circuit 260. Not shown in FIG. 2 are buses that interconnect these components.

Request 270 and response 272 carry processor requests and responses to other circuitry in the system (described as uncore circuit 170 in FIG. 1). Requests and responses may specify a type (e.g., load, divide, send), parameters (e.g., load address, divisor/dividend, NoC address), and for requests that generate a response, may specify the destination register that awaits the requested operation result.

For example, upon the scheduler 234 issuing a load instruction held in the instruction register 222, a load-base-address register may be read from the register file 250, with which the load/store circuit LDST 258 may compute the load address and format a load-request message 270. By this time, the scheduler circuit 234 will also have marked the load instruction's destination register busy in the scoreboard circuit 230. Eventually, the load-response message 272 is received by the processor circuit 210. The response 272 includes the destination register number (or other data from which the destination register number may be indicated) and the load data, which the result unit 260 selects and writes back to the specified register in the register file 250. In addition, the scheduler circuit 234 may signal scoreboard circuit 230 by scoreboard control signals 227 to update the partial state for the destination register, which is no longer busy, but is now idle.

Figure 3:
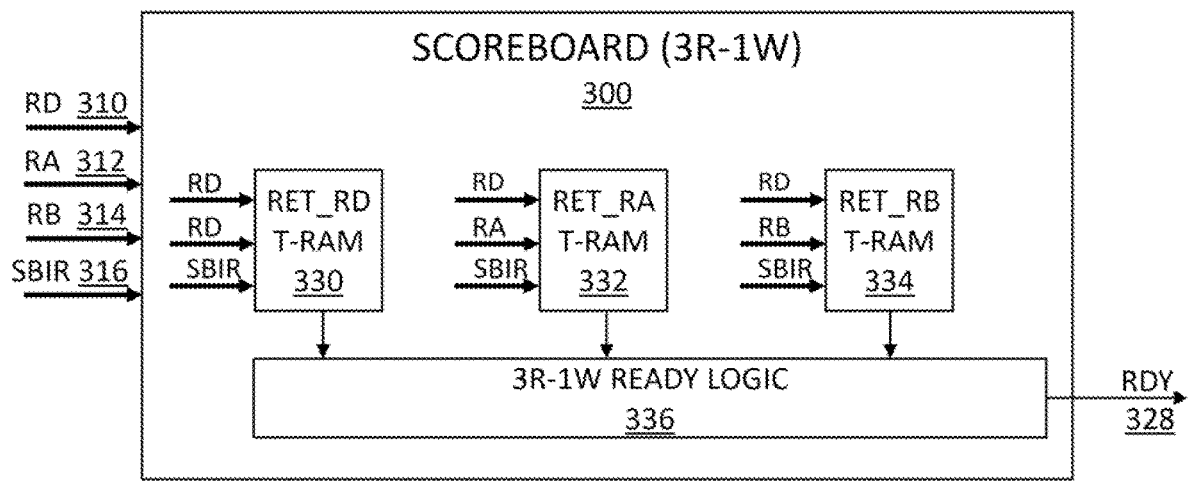
FIG. 3 is a block diagram of a scoreboard circuit with three read ports and one write port, according to an embodiment.

FIG. 3 is a block diagram of a scoreboard circuit 300, according to an embodiment, with three read ports and one write port. This embodiment keeps busy-state entries directly (i.e., not as multiple partial state entries across multiple memories) and, therefore, does not support simultaneous issue and completion (also called retirement) per cycle. But the scoreboard circuit 300 serves to illustrate the basic use of a T-RAM (toggle RAM) to implement a multiple-read-port scoreboard circuit instead of using flip-flops.

Scoreboard circuit 300 inputs include RD 310, RA 312, RB 314, and SBIR 316 ("scoreboard issue and retirement control"). In an embodiment, RD, RA, and RB are each a respective five- or six-bit bus identifying one of 32 or 64 registers. Scoreboard circuit 300 outputs signal RDY 328, which may indicate that the scoreboard circuit has determined none of the registers specified by RD, RA, or RB are busy. When an instruction issues or retires, the scheduler circuit (e.g., the scheduler circuit 234 of FIG. 2) may assert signals in SBIR that cause the scoreboard's T-RAMs to toggle their copy of the entry indicated by RD, from 0 to 1 or from 1 to 0 (i.e., from idle to busy, from busy to idle).

Scoreboard circuit 300 includes three T-RAMS 330, 332, 334. Each T-RAM RET_RD 330, RET_RA 332, and RET_RB 334, contains an identical copy of the busy state. Each T-RAM circuit has a write port indexed by RD. Each has a read port indexed, respectively by RD, RA, and RB.

The 3R-1 W ready logic circuit 336 is a NOR gate—if any register's busy output is asserted, the current instruction is not ready to issue.

Figure 4A:
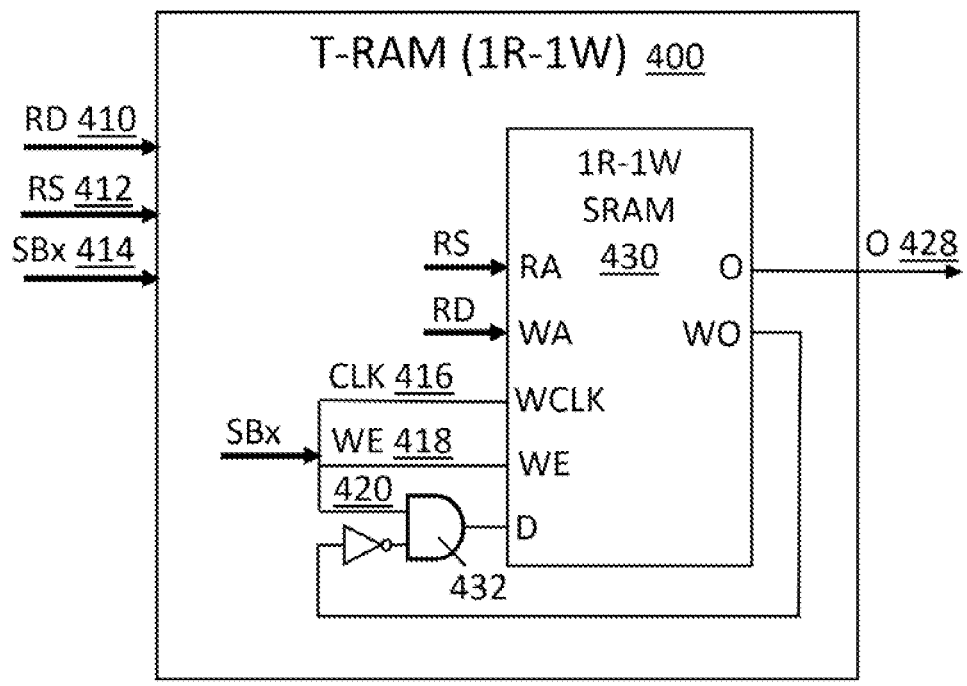
FIG. 4A is a block diagram of a 1-read/1-write per cycle T-RAM (toggle-RAM) circuit, according to an embodiment.

FIG. 4A is a block diagram of a 1-read/1-write per cycle T-RAM (toggle-RAM) circuit 400, according to an embodiment. T-RAM circuit 400 receives a destination-register specifier RD 410, a source-register specifier RS 412, and a scoreboard-control-bundle bus 414. The T-RAM circuit 400 outputs the busy or partial-busy state indicator for source register RS 412 on output O 428. T-RAM circuit 400 includes a dual-port SRAM 430, which is configured to implement one read and one write access per clock cycle.

Scoreboard control bundle 414 includes a clock CLK 416, a signal RAM write-enable (WE) 418, and a signal toggle enable T 420. Each cycle, as the clock rises, if WE is asserted, then the RAM entry addressed by RD is updated. The AND gate 432 together with the SBx signal T 420 is used either to initialize an entry or to toggle it. If T 420 is negated, then the entry is zeroed. If T 420 is asserted, then the entry at RD is replaced by its negation, i.e., the RAM 430 toggles the stored bit from 0 to 1, or from 1 to 0.

In a modern Xilinx FPGA, RAM 430 may be implemented by a RAM32x1D or RAM64x1D element. Either implementation consumes two 6-LUTs.

Figure 4B:
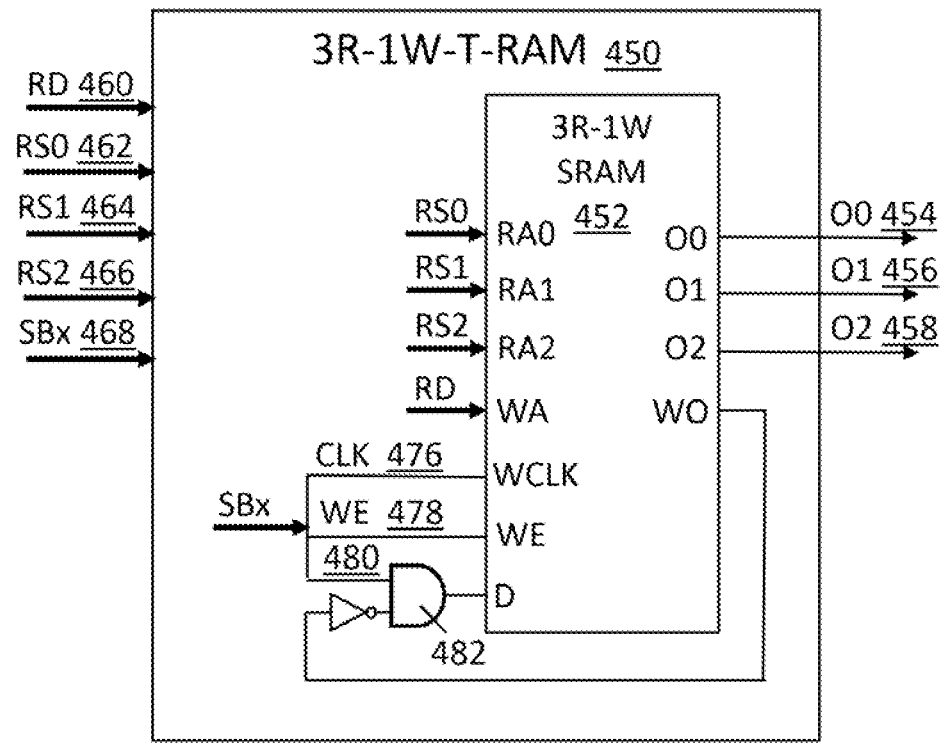
FIG. 4B is a block diagram of a 3-read/1-write-per-cycle T-RAM (toggle-RAM) circuit, according to an embodiment.

FIG. 4B is a block diagram of a 3-read/1-write per cycle T-RAM (toggle-RAM) circuit 450, according to an embodiment. T-RAM circuit 450 receives a destination-register specifier RD 460, a first source-register specifier RS0 462, a second source-register specifier RS1 464, a third source-register specifier RS2 466, and receives a bundle of scoreboard control signals via a scoreboard control bundle 468. The T-RAM circuit 450 outputs the respective busy- or partial-busy-state indicator for source register RS0 460 on output O0 454, for source register RS1 264 on output O1 456, and for source register RS2 466 on output O2 458. T-RAM circuit 450 includes a quad port RAM 452 configured to implement three read accesses and one write access per clock cycle.

Just as with FIG. 4A, scoreboard control bundle SBx 468 includes a clock CLK 476, a signal RAM write enable WE 478, and a signal toggle enable T 480. Each cycle as CLK rises, if WE is asserted, the RAM entry addressed by RD is updated. The AND gate 482 together with the SBx signal T is used either to initialize an entry or to toggle it. If T is negated (i.e., in this embodiment if T=logic 0), the entry is zeroed. If T is asserted (i.e., in this embodiment if T=logic 1), the entry at RD is replaced by its negation, i.e., it toggles from logic 0 to logic 1, or from logic 1 to logic 0.

For example, in a modern Xilinx FPGA, RAM 452 may be implemented in approximately half of a RAM32M16 or RAM64M8 RAM cluster. Either implementation consumes eight 6-LUTs. Although not shown in FIG. 4B, in another embodiment, an analogous 6R-1 W-T-RAM also fits in a RAM32M16 or RAM64M8 for the same cost of 6-LUTs.

As the FPGA resource use of a 3R-1 W-T-RAM 450, or of a 6R-1 W-T-RAM, is approximately four times the resource use of a 1R-1 W-T-RAM 400, it is apparent that in some embodiments and scoreboard architectures it is more economical to use a few 1R-1 W-T-RAMs instead of one kR-1 W-T-RAM. Then again, LUT counts do not capture the whole story. The use of T-RAMs that use highly multiported RAM clusters such as RAM64M8 may have the advantage in speed, since the reduced routing to bring the control signals to a few Xilinx SLICEM logic clusters may result in shorter wire delays.

Figure 5A:
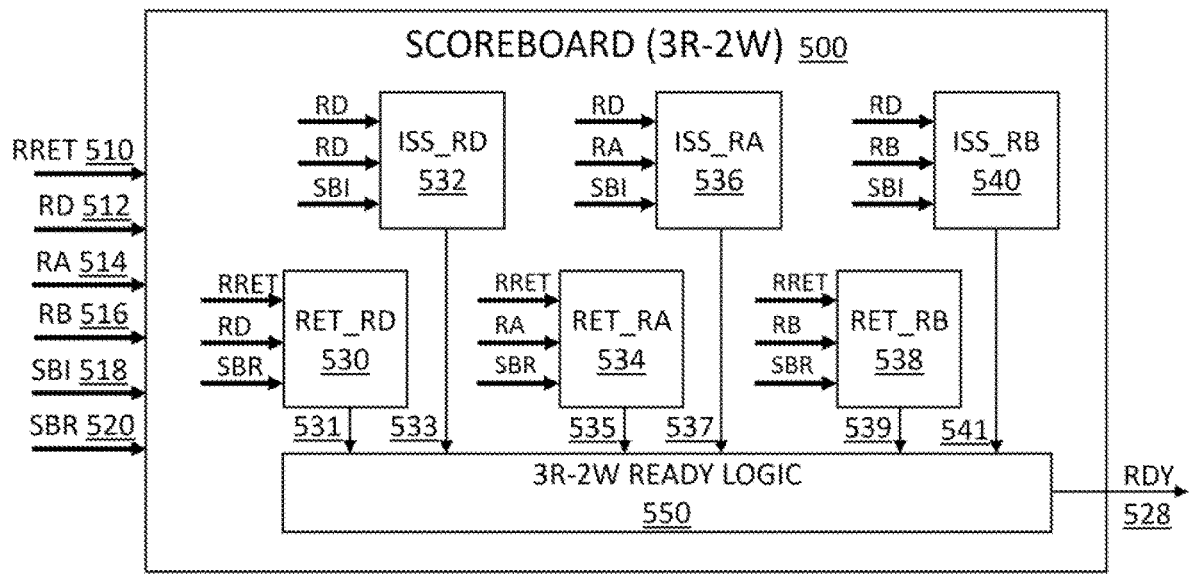
FIG. 5A is a block diagram of a scoreboard circuit with three read ports and two write ports, according to an embodiment.

FIG. 5A is a block diagram of a scoreboard circuit 500 with three read ports and two write ports, according to an embodiment. The scoreboard circuit 500 is a suitable embodiment of a busy-register scoreboard circuit for a processor circuit configured to execute instructions which reference up to three registers (destination register RD 512, and source registers RA 514 and RB 516), to issue a long-latency-operation instruction to be written to destination RD 512, and to retire a long-latency-operation result written back to retirement register RRET 510, each cycle. Scoreboard control bundle SBI 518 controls whether to update destination register RD 512's partial-busy-state entry to reflect it has become busy, and scoreboard control bundle SBR 520 controls whether to update retirement destination register RRET 510's partial-busy-state entry to reflect it is no longer busy (i.e., is now idle).

Scoreboard circuit 500 includes six 1 W-1R-TRAMs, 530, 532, 534, 536, 538, 540, and a 3R-2 W ready logic circuit 550. Each T-RAM circuit corresponds to T-RAM circuit 400 of FIG. 4A. T-RAMs RET_RD 530, RET_RA 534, and RET_RB 538 contain identical copies??? of the partial busy-state information for the registers, of which the current entry at address RRET is toggled whenever a scoreboarded instruction is retired. Similarly, T-RAMS ISS_RD 532, ISS_RA 536, and ISS_RB 540 contain identical copies of the partial busy-state information for the registers, of which the current entry at address RD is toggled whenever a scoreboarded instruction issues. In an embodiment, a "scoreboarded instruction" is an instruction for which a register's busy-ness or readiness is read or updated by the scoreboard circuit. In an embodiment, an instruction with a destination register is a scoreboarded instruction. In another embodiment, an instruction with a destination register and a latency greater than one clock cycle is a scoreboarded instruction. In an embodiment, any instruction can be a scoreboarded instruction if a non-operative destination register is used in the absence of a destination register specified by a field of the instruction.

When a new instruction in the instruction register 222 is decoded and the constituent register numbers RD 512, RA 514, and RB 516 are presented to the scoreboard circuit 500 by the instruction decoder circuit 224 (FIG. 2), the scoreboard circuit concurrently reads the contents of the six T-RAMs corresponding to the specified registers. For example, RET_RA 534 reads out the (retirement) partial busy state for register RA and ISS_RA 536 reads out the (issue) partial busy state for register RA. The issue, retirement x RD, RA, RB partial busy states are presented to the 3R-2 W ready logic circuit 550.

Figure 5B:
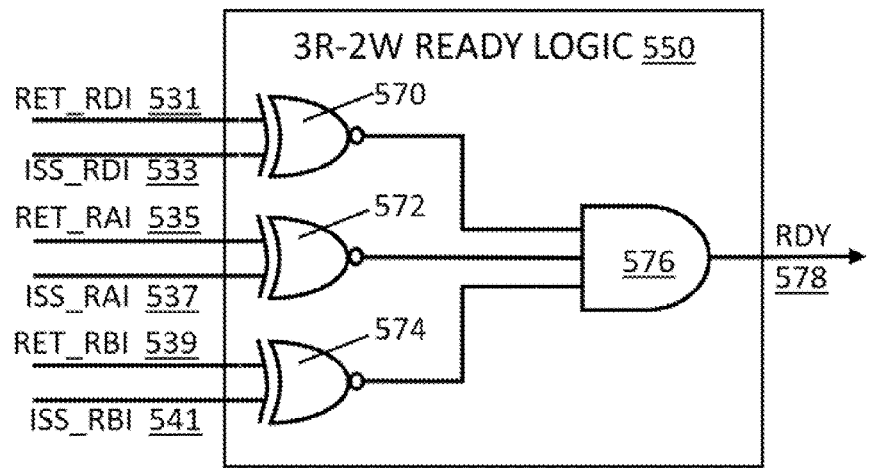
FIG. 5B is a block diagram of the ready logic circuit of the scoreboard circuit of FIG. 5A, according to an embodiment.

FIG. 5B is a block diagram of the ready logic circuit 550 of the scoreboard circuit 500 of FIG. 5A, according to an embodiment. As noted, the logic circuit 550 is configured to receive the partial busy states from scoreboard circuit 500 and to determine whether any of the three specified registers are busy. Together the circuit inputs RET_RDI 531 and ISS_RDI 533 indicate whether the destination register RD 512 is busy; together the inputs RET RAI 535 and ISS_RAI 537 indicate whether the first source register RA 514 is busy; and together the inputs RET_RBI 539 and ISS_RBI 541 indicate whether the second source register RB 516 is busy. The logic circuit 550 is configured to assert output RDY 578 (true) when none of the three registers specified by RD, RA, and RB are busy.

For example, if initially all entries of all T-RAM circuits of scoreboard circuit 500 are zero, then when an instruction with destination register x7 issues, ISS_RA[7], ISS_RB[7], and ISS_RD[7] all toggle from 0 to 1. Then, if a subsequent instruction references x7 as its first source register (i.e. RA=7), then circuit 550 receives ISS_RAI=ISS_RA[7]=1 and RET RAI=RET_RA[7]=0. It follows that the first source register RA is busy because the parity of the number of times an instruction with destination register x7 has issued does not agree with the parity of the number of times such an instruction has retired. Thus, here the XNOR gate 572 is negated, as is the AND gate 576, indicating that at least one referenced register is busy and, therefore, the current instruction is not ready to issue.

Conversely if a few cycles later, the prior instruction with destination register x7 retires, the entries RET_RD[7], RET_RA[7], and RET_RB[7] all toggle from 0 to 1. If a subsequent instruction references x7 as its first source register (i.e., RA=7), then circuit 550 receives ISS_RAI=ISS_RA[7]=1 and RET RAI=RET_RA[7]=1. Here it follows that the first source register RA is idle because the parity of the number of times an instruction with destination register x7 has issued equals the parity of the number of times such an instruction has retired. Thus, here the XNOR gate 572 is asserted, indicating that the register indicated by RA is idle.

Returning to FIG. 5A, T-RAMs RET_RD 530, RET_RA 534, and RET_RB 538 are all configured with a common write-port register RRET and SB control bundle SBR. Thus, when an instruction retires, the same register entry at RRET toggles in each T-RAM circuit. Similarly, T-RAMS ISS_RD 532, ISS_RA 536, and ISS_RB 540 are all configured with a common write-port register RD and SB control bundle SBI. Thus, when an instruction issues, the same register entry at RD toggles in each T-RAM circuit.

Figure 5C:
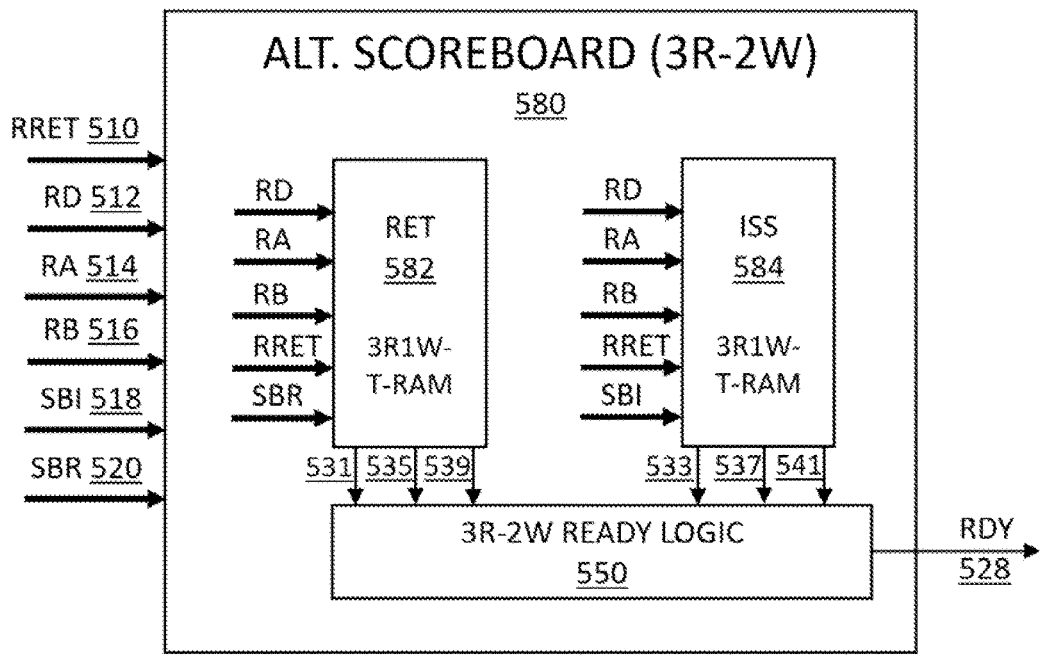
FIG. 5C is a block diagram of another scoreboard circuit with three read ports and two write ports implemented with 3R2 W-T-RAMs, according to an embodiment.

FIG. 5C is a block diagram of another scoreboard circuit 580 with three read ports and two write ports implemented with 3R1 W-T-RAM circuits, according to an embodiment. Scoreboard circuit 580 is an alternative embodiment of scoreboard circuit 500. Scoreboard circuit 580 is configured to behave identically with scoreboard circuit 500. Whereas scoreboard circuit 500 uses three 1R-1 W-T-RAMS 400 to implement three copies of the (retirement) partial busy-state information for the registers and another three 1R-1 W-T-RAMs 400 to implement three copies of the (issue) partial busy-state information for the registers, scoreboard circuit 580 uses one 3R-1 W-T-RAM circuit 450 for the (retirement) partial busy-state information and one 3R-1 W-T-RAM 450 circuit for (issue) partial busy-state information. The same partial entry readout signals 531, 533, 535, 537, 539, 541 and same ready logic 550 apply.

In some embodiments and implementation technologies, scoreboard circuit 500 may be more compact or faster; in others scoreboard circuit 580 may be more suitable for certain applications.

In an embodiment, in a Xilinx 6-LUT FPGA, the scoreboard-RDY-determination logic circuit incurs only two LUT delays. All T-RAM circuit read-port outputs occur simultaneously and take one LUT delay; and the six-input ready logic circuit 550 may be implemented in a single 6-LUT, which is the second LUT delay. Since the scoreboard circuit 580 has at least 15 input signals (three 5-bit register buses RD, RA, RB), it may not be possible to implement the scoreboard circuit in a single 6-input LUT, or one LUT delay. Thus, this embodiment exhibits a best-case LUT delay for the scoreboard-circuit for the given FPGA architecture.

Figure 6:
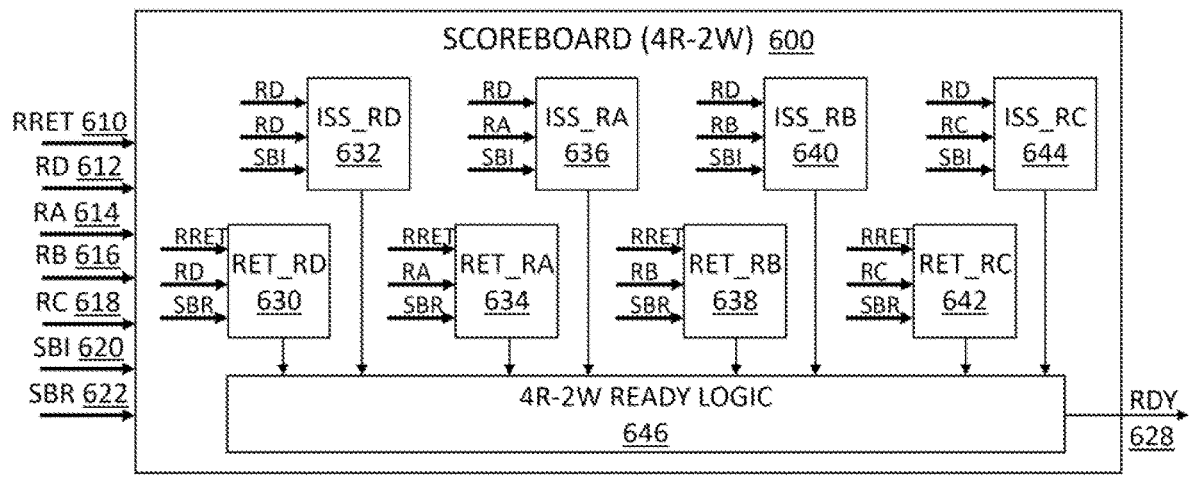
FIG. 6 is a block diagram of a scoreboard circuit with four read ports and two write ports, according to an embodiment.

FIG. 6 is a block diagram of a scoreboard circuit 600 with four read ports (RD, RA, RB, and RC) and two write ports (RRET, RD), according to an embodiment. Like scoreboard circuit 500, scoreboard circuit 600 supports one issue and one retirement update to the scoreboard circuit per cycle. Scoreboard circuit 600, however, supports up to three source registers and one destination register and would be suitable in embodiments where the processor's instruction-set architecture presents three source registers (or other resources) which use scoreboard tracking. The scoreboard circuit 600 includes two additional T-RAMs RET_RC 642 and ISS_RC 644, which are configured to provide an additional replica of the (retired) and (issued) partial-busy-state-information memory circuits and, therefore, one additional read port for input RC 618. Analogously to ready logic circuit 550 of FIGS. 5A-5C, the 4R-2 W ready logic circuit 646 is of relatively low complexity and includes an AND gate configured to receive the output signals of four two-input XNOR gates (neither the AND gate nor the XNOR gates shown in FIG. 6).

Figure 7:
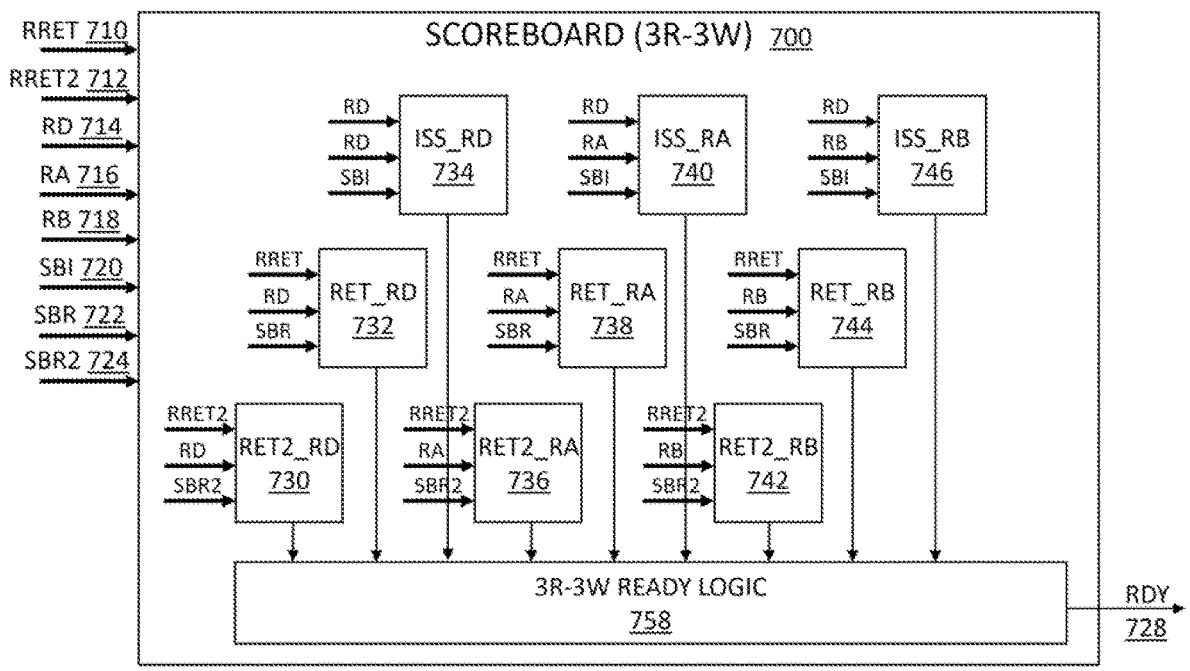
FIG. 7 is a block diagram of a scoreboard circuit with three read ports and three write ports, according to an embodiment.

FIG. 7 is a block diagram of a scoreboard circuit 700 with three read ports and three write ports, according to an embodiment. Like scoreboard circuit 500, scoreboard circuit 700 supports up to two source registers RA 716 and RB 718 and a destination register RD 714. Like scoreboard circuit 500, scoreboard circuit 700 supports a processor circuit issuing one instruction per cycle. But unlike scoreboard circuit 500, scoreboard circuit 700 supports retiring up to two instructions per cycle. Additional T-RAMs RET2_RD 730, RET2_RA 736, and RET2_RB 742 have a common write-address register RRET2 712 and common scoreboard-control bundle SBR2 724.

In this embodiment, the busy state of a register is distributed amongst three partial busy-state entries in three memories ISS_x[i], RET_x[i], and RET2_x[i] (and for each of which there are three replicas _RD[i], _RA[i], and _RB[i]). When an instruction issues with destination RD, ISS_x[RD] toggles. Later when the instruction retires, signaled either on the RRET/SBR port or on the RRET2/SBR2 port, one of RET_x[RRET] or RET2_x[RRET2] toggles. In an embodiment, the processor circuit does not issue an instruction if its own destination register is busy, so at most one operation to a given destination register may be outstanding. When the operation completes, the scheduler signals completion on RRET/SBR or RRET2/SBR2, but not both. Thus, a register indicated by a field of the instruction, i.e., an indicated register, is busy if the parity of its ISS, RET, and RET2 partial-busy-state entries is odd. Thus, the 3R-3 W ready logic 758 is the AND reduction of three three-input XNOR gates (neither the AND gate nor the XNOR gates shown in FIG. 7).

Figure 8:
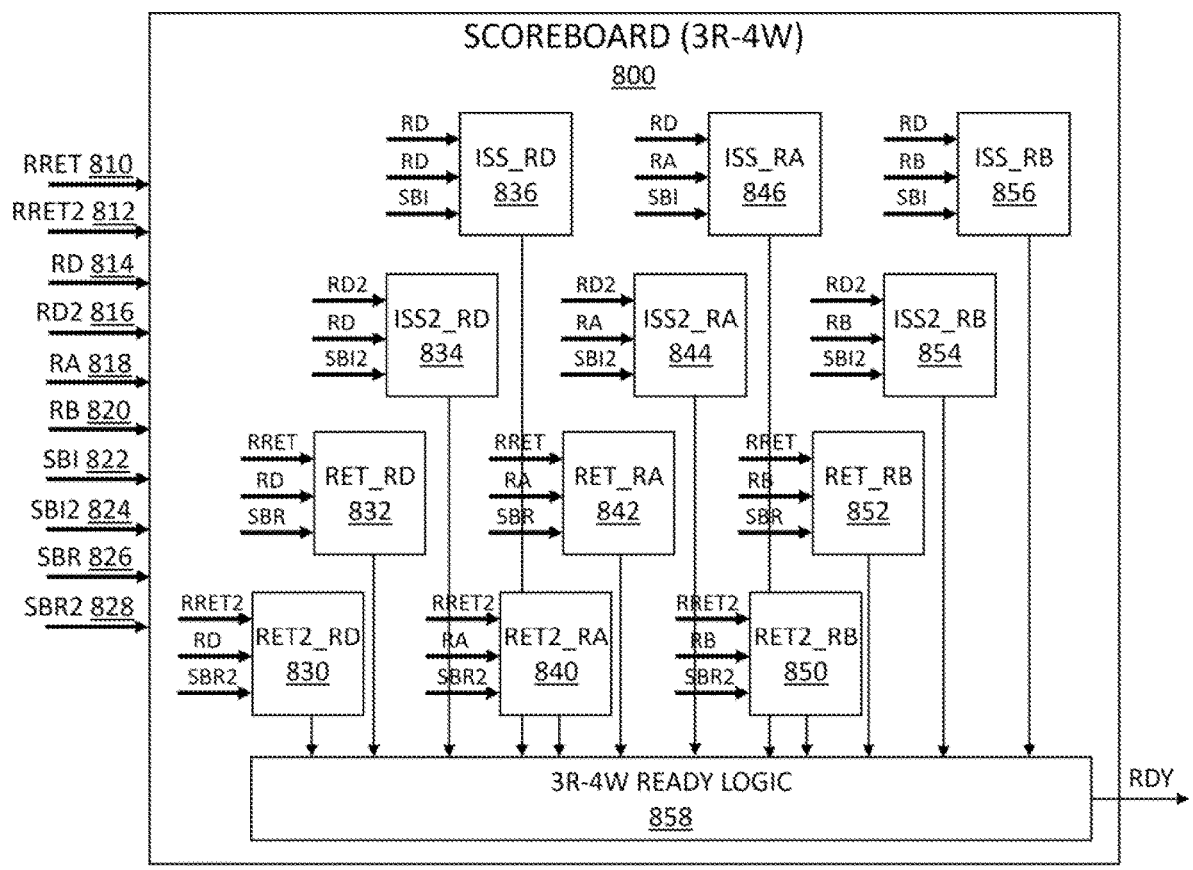
FIG. 8 is a block diagram of a scoreboard circuit with three read ports and four write ports, according to an embodiment.

FIG. 8 is a block diagram of a scoreboard circuit 800 with three read ports (RD, RA, RB) and four write ports (RRET, RRET2, RD, RD2), according to an embodiment. Like scoreboard circuit 700 of FIG. 7, scoreboard circuit 800 supports up to two source registers RA 818 and RB 820, one destination register RD 814, two retirement registers RRET 810 and RRET2 812, and their associated scoreboard-control bundles SBR 826 and SBR2 828. Unlike scoreboard circuit 700, scoreboard circuit 800 supports an additional write port RD2 816 and scoreboard-control bundle SBI2 824. As described below in conjunction with FIG. 9, these four write ports RD/SBI, RD2/SBI2, RRET/SBR, and RRET2/SBR2 allow a corresponding processor circuit to implement a superscalar processor circuit may issue two instructions per clock cycle and retire two instructions per clock cycle.

In an embodiment, to the complement of T-RAMs of scoreboard circuit 700 of FIG. 7, scoreboard circuit 800 adds T-RAMS ISS2_RD 834, ISS2_RA 844, and ISS2_RB 854, with a common write-address register RD2 and common scoreboard-control bundle SBI2 824.

Still referring to FIG. 8, the busy state of a register is distributed amongst four partial-busy-state entries in four memory circuits ISS_x[i], ISS2_x[i], RET_x[i], and RET2_x[i] (and for each of which there are three replicas RD[i], RA[i], and RB[i]). In response to the processing circuit issuing an instruction with destination RD, scoreboard-circuit location ISS_x[RD] toggles its contents (e.g., a single bit). And in response to the processing circuit issuing an instruction with destination RD2, scoreboard-circuit location ISS2_x[RD] toggles its contents (e.g., a single bit). In an embodiment, it is the responsibility of the superscalar instruction scheduler not to issue, in the same clock cycle, two instructions that may target the same destination register. The scheduler is configured to detect this same-destination-register condition and to mitigate this condition by, for example, not issuing, in the same clock cycle, multiple instructions that target the same destination (for example, by issuing only the first of the two instructions in current clock cycle.) Later, in response to the corresponding sole instruction with this destination retiring as signaled either on the RRET/SBR port or on the RRET2/SBR2 port, one of RET_x[RRET] or RET2_x[RRET2] toggles its contents. As described above, in an embodiment the processor circuit does not issue an instruction if its own destination register is busy, so at most one operation to a given destination register may be outstanding. In response to the operation completing, the scheduler circuit signals completion on RRET/SBR or RRET2/SBR2, but not both. In summary an idle register may transition to busy by toggling exactly one of its ISS or ISS2 entries, and a busy register may transition to idle by togging exactly one of its RET or RET2 entries. Thus, an instruction includes a busy destination register if and only if the parity of the destination register's ISS, ISS2, RET, and RET2 partial-busy-state entries is odd. Thus, the 3R-4 W ready logic circuit 758 is the AND reduction of three four-input XNOR gates (neither the AND gate nor the XNOR gates shown in FIG. 8).

Figure 9:
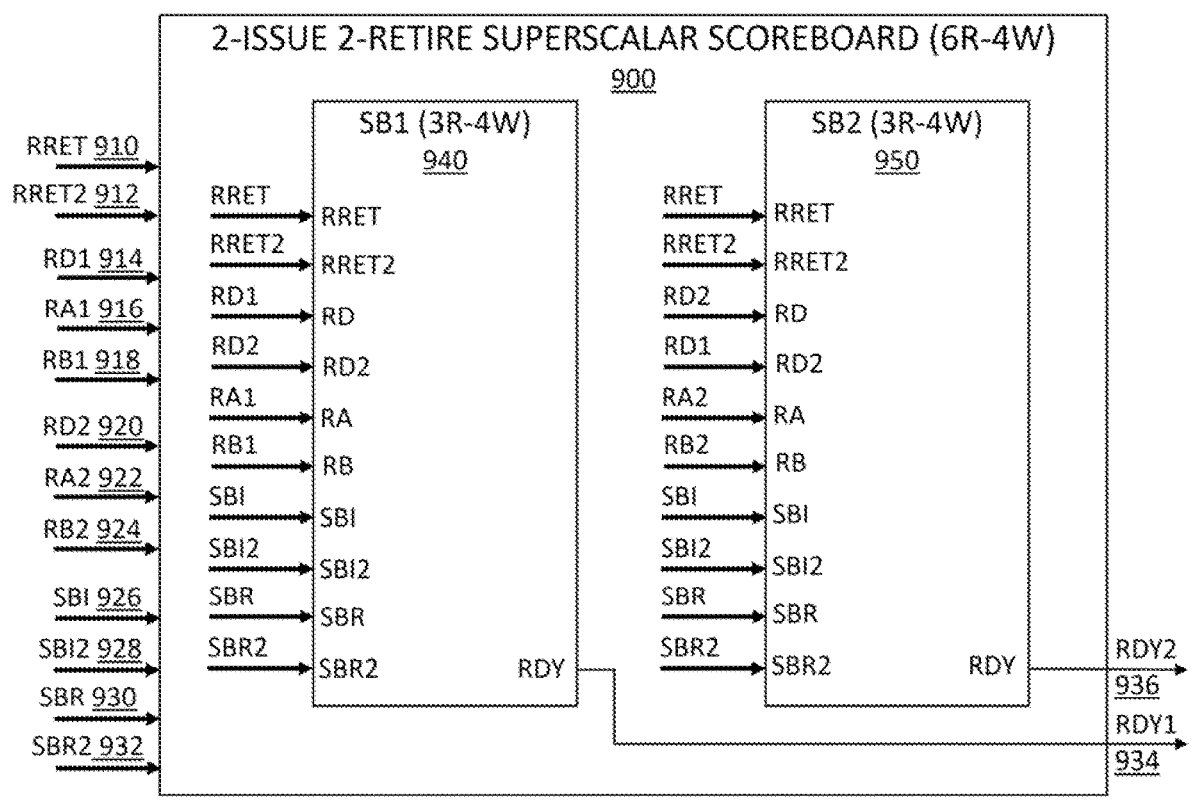
FIG. 9 is a block diagram of a scoreboard circuit with six read ports and four write ports, as might be included in a superscalar microprocessor that is configured to issue two instructions per clock and complete two instructions per clock, according to an embodiment.

FIG. 9 is a block diagram of a scoreboard circuit with six read ports (RD1, RA1, RB1, RD2, RA2, RB2) and four write ports (RRET, RRET2, RD1, RD2), as might be used in a superscalar-processor circuit that is configured to issue two instructions per clock and to complete two instructions per clock, according to an embodiment. Scoreboard circuit 900 accepts two sets of three destination-register specifiers RD1 914, RA1 916, RB1 918, and RD2 920, RA2 922, RB2 924, as well as two sets of retirement-register specifiers RRET 910 and RRET2 912, and four scoreboard-control bundles SBI 926, SBI2 928, SBR 930, and SBR2 932.

Superscalar scoreboard circuitry 900 includes two 3R-4 W scoreboard circuits SB1 940 and SB2 950, each being similar to, or otherwise corresponding to, 3R-4 W scoreboard circuit 800 of FIG. 8. SB1 and SB2 are configured, during each clock cycle, to read, concurrently, all the partial-busy-state information across all partial entries, to compute, concurrently, the respective parities of each set of partial entries to determine whether any of the respective read-port registers RDx, RAx, RBx are busy, and to assert RDY1 934 and RDY2 936 in response to the respective parities. Also, each cycle, the scoreboard circuit 900 may toggle the partial-busy entries for up to two issued instructions and for up to two retired instructions. Although scoreboard circuit 900 consumes, or otherwise includes, a considerable number of 1R-1 W-T-RAMs, overall the resource use and delay are competitive with flip-flop-array approaches.

Figure 14:
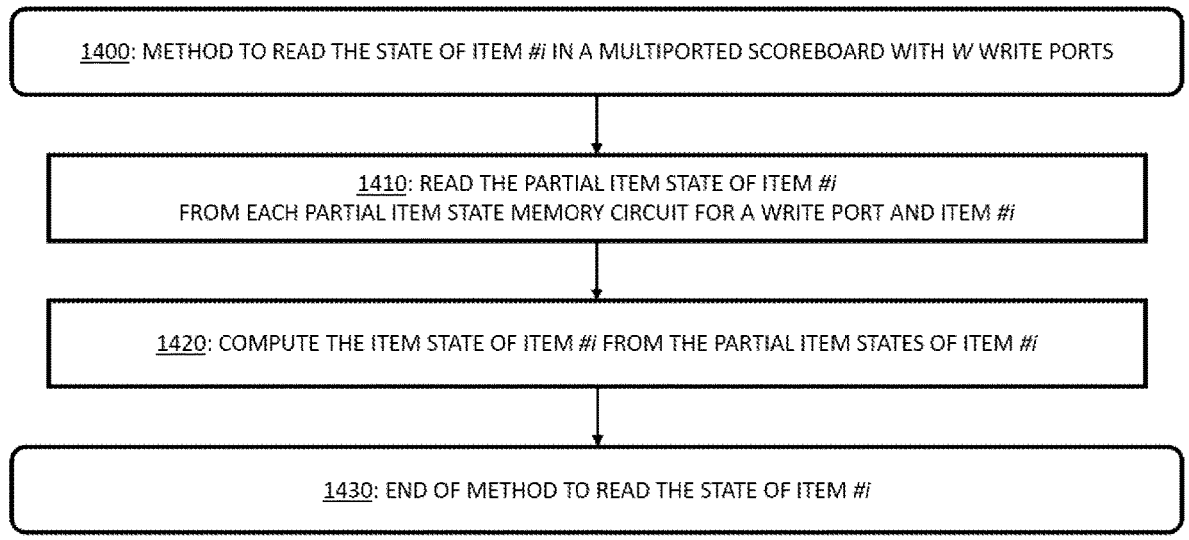
FIG. 14 is flowchart of a method to read the state of an item #i in a generic multiported scoreboard circuit with w write ports, according to an embodiment.

In an embodiment in an FPGA, instead of using many 1R-1 W-T-RAMs to provide replicas to read out a respective partial-busy state for so many source registers, a scoreboard circuit may use 6R-1 W or 7R-1 W T-RAMs, implemented with multiported LUT-RAM clusters such as Xilinx 7R-1 W RAM64M8. FIG. 14 is a schematic diagram of an FPGA implementation of such an embodiment.

Figure 10:
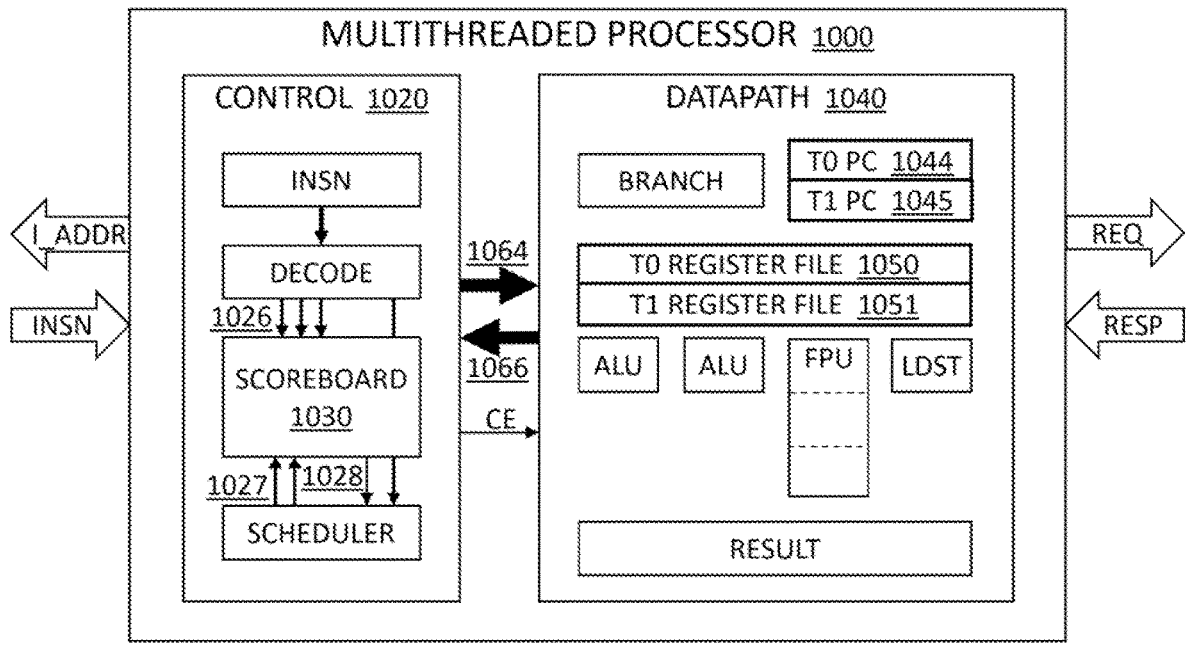
FIG. 10 is a block diagram of a multithreaded microprocessor, according to an embodiment.

FIG. 10 is a block diagram of a multithreaded processor circuit 1000, according to an embodiment. In an embodiment, the multithreaded processor circuit 1000 includes a plurality of thread contexts, and, on a cycle-by-cycle basis, may be configured to fetch, decode, issue, execute, and retire instructions from one thread, or another, or even interleave execution, alternating instruction execution from each thread. For example, in operation, a pipelined multithreaded processor circuit with two thread contexts might have instruction I0 from thread 0 in the WB stage, instruction 1100 from thread 1 in the EX stage, instruction I1 from thread 0 in the DC stage, and instruction 1101 from thread 1 in the fetch stage.

The multithreaded processor circuit 1000 includes a control circuit or unit 1020 and a datapath circuit 1040. Compared to the processor circuit 210 of FIG. 2, datapath circuit 1040 includes a plurality of thread contexts, including program counters T0 PC 1044 and T1 PC 1045 for two threads T0 and T1, and includes a physical register file including two copies of the logical register file, T0 register file 1050 and T1 register file 1051. Control signals 1064 and 1066, which the control circuit 1020 and the datapath 1040 are respectively configured to generate, specify which thread context to use for which operations in the datapath and which datapath results (including which responses to long-latency operations) pertain to thread 0 or thread 1. In alternative embodiments, a multithreaded processor circuit may have more than two thread contexts.

In an embodiment, out-of-order execution of long-latency operations in the multithreaded processor circuit 1000 is facilitated by a busy-register scoreboard circuit 1030 that has the same basic register-identifier ports 1026, scoreboard-control ports 1027, and ready-signal port 1028 as described above in conjunction with FIGS. 3-9. In an embodiment, the scoreboard circuit 1030 includes a plurality of partial-busy=state-information memory circuits with capacity to track the partial-busy-state information of every register in every thread context in the processor circuit. In an embodiment of a multithreaded processor circuit configured to execute two thread contexts, each thread context including a 32-entry register file, a busy-register scoreboard circuit tracks busy states for a total of 64 registers. In an alternative embodiment, the control circuit 1020 contains multiple instances of a single-thread-context busy-register scoreboard circuit.

In an embodiment in an FPGA, employing RAM64X1D dual-port LUT-RAMs or RAM64M8 multiport LUT-RAM clusters, the FPGA resource consumption of a scoreboard circuit implemented on the FPGA and having capacity for 32 entries corresponding to a single thread context with a register file of 32 registers, is equal to the FPGA resource consumption of a scoreboard circuit implemented on the FPGA and having capacity for 64 entries corresponding to two thread contexts each with a register file of 32 registers. In other words, in an embodiment the FPGA resource use of a two-thread-context busy-register scoreboard circuit for 32 registers for each thread context (64 registers total) is the same as the FPGA resource use of a one-thread-context busy-register scoreboard circuit for 32 registers total.

Figure 11:
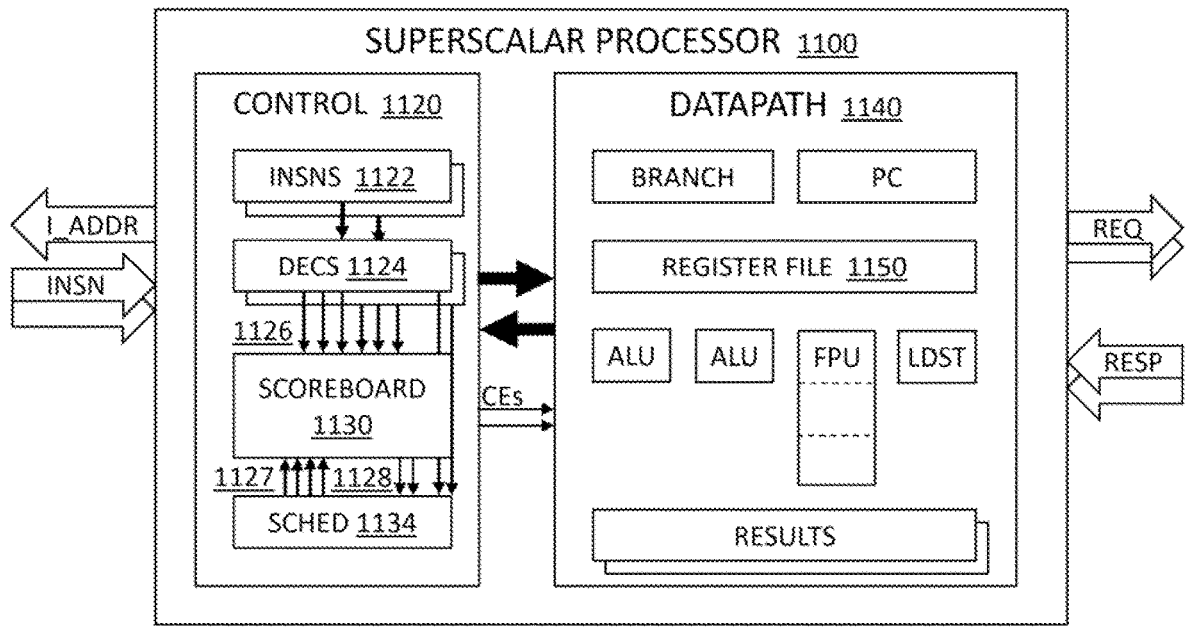
FIG. 11 is a block diagram of a superscalar microprocessor, according to an embodiment.

FIG. 11 is a block diagram of a superscalar processor circuit 1100, according to an embodiment. The superscalar processor circuit includes a control circuit 1120 and datapath circuit 1140 sufficient for configuration to fetch, decode, issue, execute, and retire a plurality of instructions per clock cycle. For example, the superscalar processor circuit 1100 is configured to fetch two instructions to instruction registers 1122, to decode the two fetched instructions simultaneously with two decoder circuits 1124, respectively, and to schedule the issue and retirement of two instructions per cycle in scheduler circuit 1134. The busy-register scoreboard circuit 1130 is coupled to the decoder circuits 1124 and scheduler circuit 1134 by register-identifier buses 1126 and scoreboard-control-bundle buses 1127 and is configured to track the busy state of the registers in the register file 1150.

In an embodiment, the busy-register scoreboard circuit 1130 is configured to accept two sets of three register identifiers 1126 including the source and destination registers of a first instruction and the source and destination registers of a second instruction, and to signal via RDY signals 1128 whether either or both of the instructions are able to issue in a current clock cycle. In an embodiment, the busy-register scoreboard circuit 1130 is also configured to accept scoreboard-control bundles 1127 to update the scoreboard circuit to reflect that destination register(s) of instructions(s) that issued during the current clock cycle are now busy and to reflect that destination register(s) of instruction(s) that retired during the current clock cycle are now idle. In an embodiment, busy-register scoreboard circuit 1130 is the same as, or otherwise similar to, the to the superscalar scoreboard circuit 900 of FIG. 9.

Figure 12:
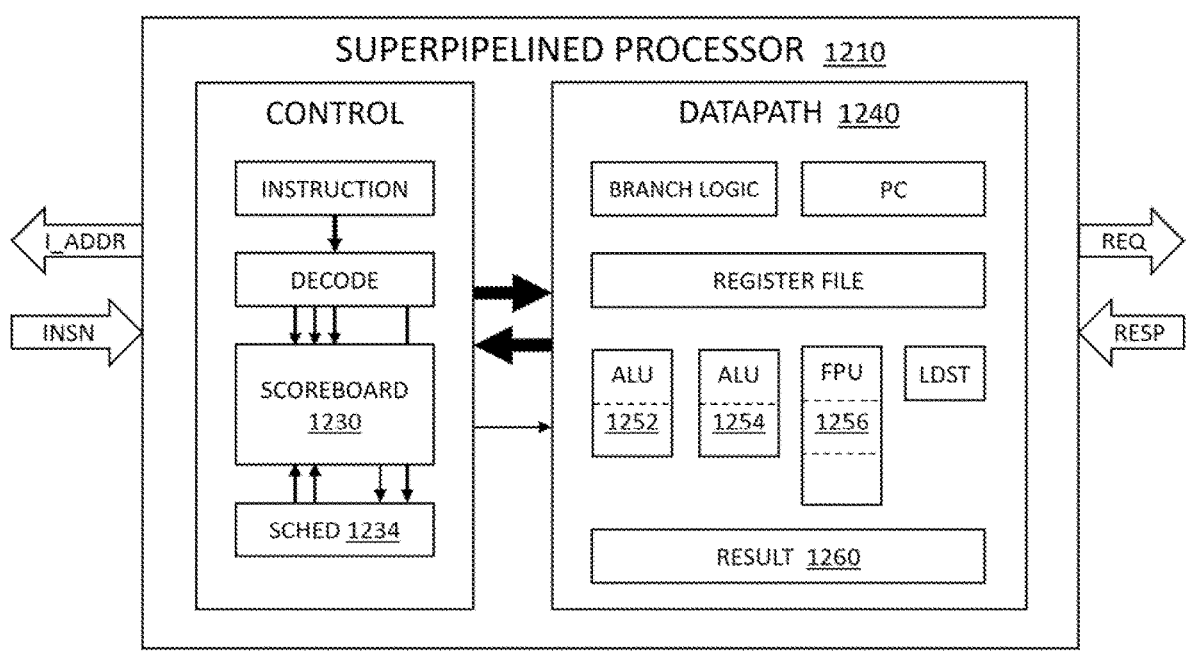
FIG. 12 is a block diagram of a superpipelined microprocessor, according to an embodiment.

FIG. 12 is a block diagram of a superpipelined processor circuit 1210, according to an embodiment. The superpipelined processor circuit is configured to support a pipeline clock frequency that is so fast that even an integer ALU (arithmetic logic unit) of the datapath 1240 uses more than one cycle of latency to complete a simple integer add instruction. For example, a pipelined FPGA implementation of a RISC processor circuit may have a minimum cycle time of 2.5 ns (400 MHz instruction-pipeline clock) with an integer ALU instruction latency of one cycle, whereas a superpipelined implementation of the same design, with a pipeline register between the ALU and the result mux and the register file write, may have a minimum cycle time of 1.67 ns (600 MHz), with an integer ALU instruction latency of two cycles. In FIG. 12, in an embodiment, the superpipelined processor circuit 1210 is configured to issue instructions into a datapath circuit 1240 wherein the ALUs 1252 and 1254 and the result mux and writeback logic 1260 are pipelined deeper such that the integer ALU instruction latency is two cycles. In an embodiment, the scoreboard circuit 1230 is configured to provide the synchronization (interlock) to preclude a read-after-write (RAW) or write-after-write (WAW) data hazard if a first instruction writes to a destination register that is the source or destination register of the next instruction. For example, in this instruction sequence:

I20: add x3,x1,x2
I21: add x5,x3,x4

I20 writes to destination register x3 and I21 reads from source register x3. If I20 issues in some clock cycle, I21 must not issue in the next clock cycle because, in the superpipelined datapath 1240, the ALU latency is two cycles. Instead, the superpipelined processor circuit is configured to stall the issue of I21 for a clock cycle pending the retirement of instruction 120 and its update of destination register x3.

In an embodiment, the superpipelined processor circuit 1210 is configured to accommodate this extra integer ALU latency introduced by superpipelining in the same way as other long-latency operations such as floating-point operations in the multi-cycle FPU (floating-point unit) 1256, and memory circuitry is configured to load or to access other resources in an uncore circuit 170 (FIG. 1), by marking the integer ALU instruction's destination register busy in the busy-register scoreboard circuit 1230, and the scheduler circuit 1234 is configured to decline to issue the dependent instruction 121 until instruction 120 retires and the instruction's destination register x3 is marked not busy once again. This relatively simple, fast, uniform accommodation of additional superpipelining-function-unit latencies can be an advantage in some applications.

Long-instruction-word (LIW) and very-long-instruction-word (VLIW) architectures are another type of high-performance processor circuit. Such architectures use a very long instruction word in which multiple operations are explicitly specified, each with explicit source and destination registers. In an embodiment, out-of-order execution of LIW instructions, or constituent-operation subinstructions, is facilitated by a busy-register scoreboard circuit with as many read ports as there are source and destination registers specified across the long instruction word, and with as many write ports as there may be destination registers of issued operations and retired operations.

Alternatively, in an embodiment, an instruction may include a tag field representing the completion of all operations within the instruction, and may include source tag field(s) encoding an explicit dependency (response dependencies) from an instruction to any result (destination register) written by a prior instruction with that tag. Then out-of-order long-latency synchronization amongst instructions may be performed, not by a busy-register scoreboard circuit but rather by a busy-tag scoreboard circuit.

Figure 13:
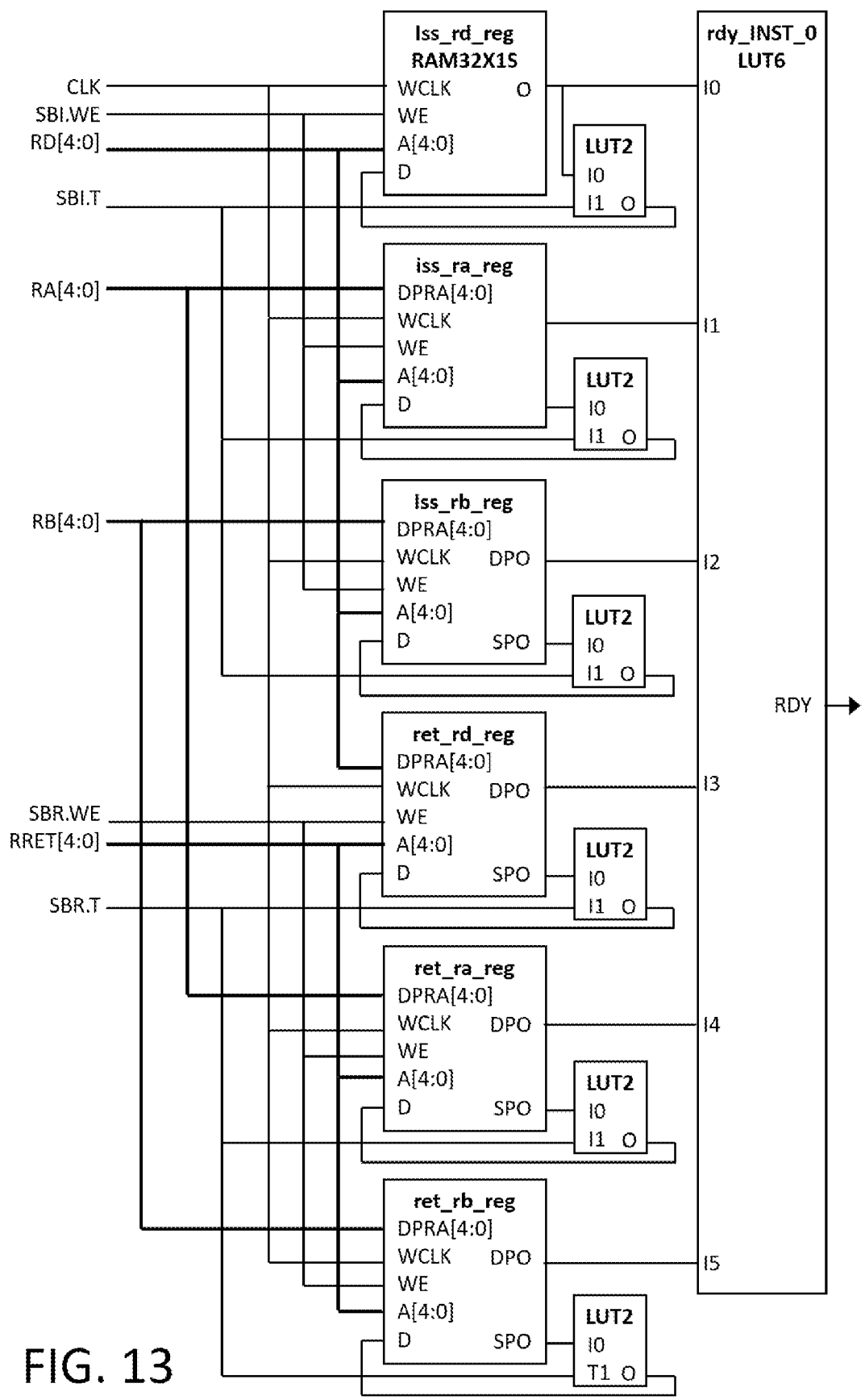
FIG. 13 is a post-FPGA-synthesis schematic diagram of a scoreboard circuit with three read ports and two write ports and implemented (e.g., instantiated), or otherwise included, in an FPGA, according to an embodiment.

FIG. 13 is a post-FPGA-synthesis schematic diagram of a scoreboard circuit with three read ports and two write ports, implemented in an FPGA, according to an embodiment. The circuit of FIG. 13 corresponds to scoreboard 500 of FIG. 5A. The six 1R-1 W SRAMs of the T-RAMS 530 532 534 536 538 540, each an instance of T-RAM 400 (FIG. 4A), are implemented in five RAM32X1D 32-entry 1R-1 W LUT-RAMs (ret_ra_reg, ret_rd_reg, iss_ra_reg, iss_rb_reg, and ret_rb_reg) and one RAM32X1S 32-entry 1RW LUT-RAM (iss_rd_reg). Six 2-input LUT2 blocks implement the T-RAM toggle logic 432 of T-RAM 400. One 6-LUT rdy_INST_0 implements the 3R-2 W ready logic 550 (FIG. 5B). In all, this circuit uses 12 6-LUTs to implement the RAM32X1Ds and RAM32X1S and four fracturable 6-LUTs to implement the toggle logic and the ready logic, or 16 6-LUTs in all.

FIG. 14 is flowchart of a method to read the state of an item #i in a generic multiported scoreboard circuit with w write ports, according to an embodiment. As has been previously described, a multiported scoreboard may be implemented using a plurality of 1-read/1-write per clock cycle memory circuits, keeping a partial item state for each item in each of w RAM circuits. Then multiple updates of the item state may be made in the same clock cycle by updating partial item state data to each of the w memories. Then the item state may be computed by reading all of the partial item states for the item #i and computing some function (such as xor, sum, equality, or maximum) over the partial item states. This flowchart illustrates this process. At step 1410, the processor circuit reads the partial item state of item #i from each write port's memory. In an embodiment the entry at address #i is read from each of the memories. Then at step 1420, the circuit combines the partial item states read in step 1410 into an overall state for the item #i using a mathematical function or algorithm.

Figure 15:
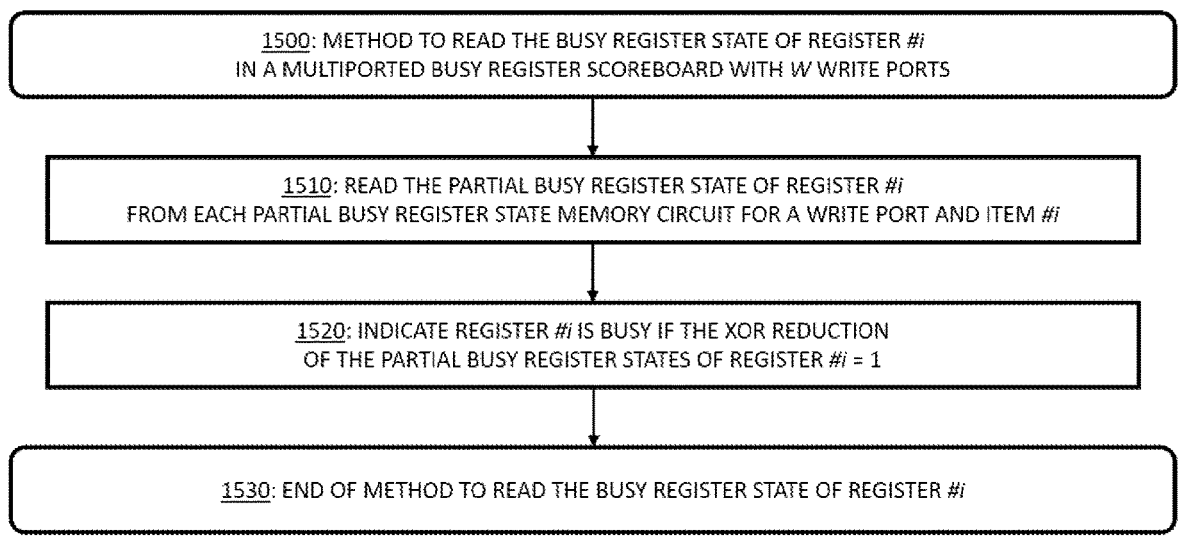
FIG. 15 is flowchart of a method to read the busy register state of register #i in a multiported busy-register scoreboard circuit with w write ports, according to an embodiment.

FIG. 15 is flowchart of a method to read the busy-register state of register #i in a multiported busy-register scoreboard circuit with w write ports, according to an embodiment. FIG. 15 illustrates how the general method of FIG. 14 applies to the specific case where the scoreboard is a busy-register scoreboard, an item is the busy state of a register, where the scoreboard keeps a busy-register state for each register in the register file; and where the partial busy-register state is one bit which toggles between 0 and 1 to indicate either the parity of the number of times an instruction has issued which targets a given register, or the parity of the number of times an instruction has retired (i.e., completed) which targets a given register. Step 1510 reads the partial busy register state of a register #i from each of the partial busy register memory circuits, one for each write port of the scoreboard. Then, at step 1520, the method indicates that register #i is busy if the Boolean exclusive-or function of the partial busy register states read in step 1510 is 1. This will be so whenever the parity of the number of times an instruction for which register #i is the destination has issued, does not equal the parity of the number of times an instruction for which register #i is the destination has retired.

Figure 16:
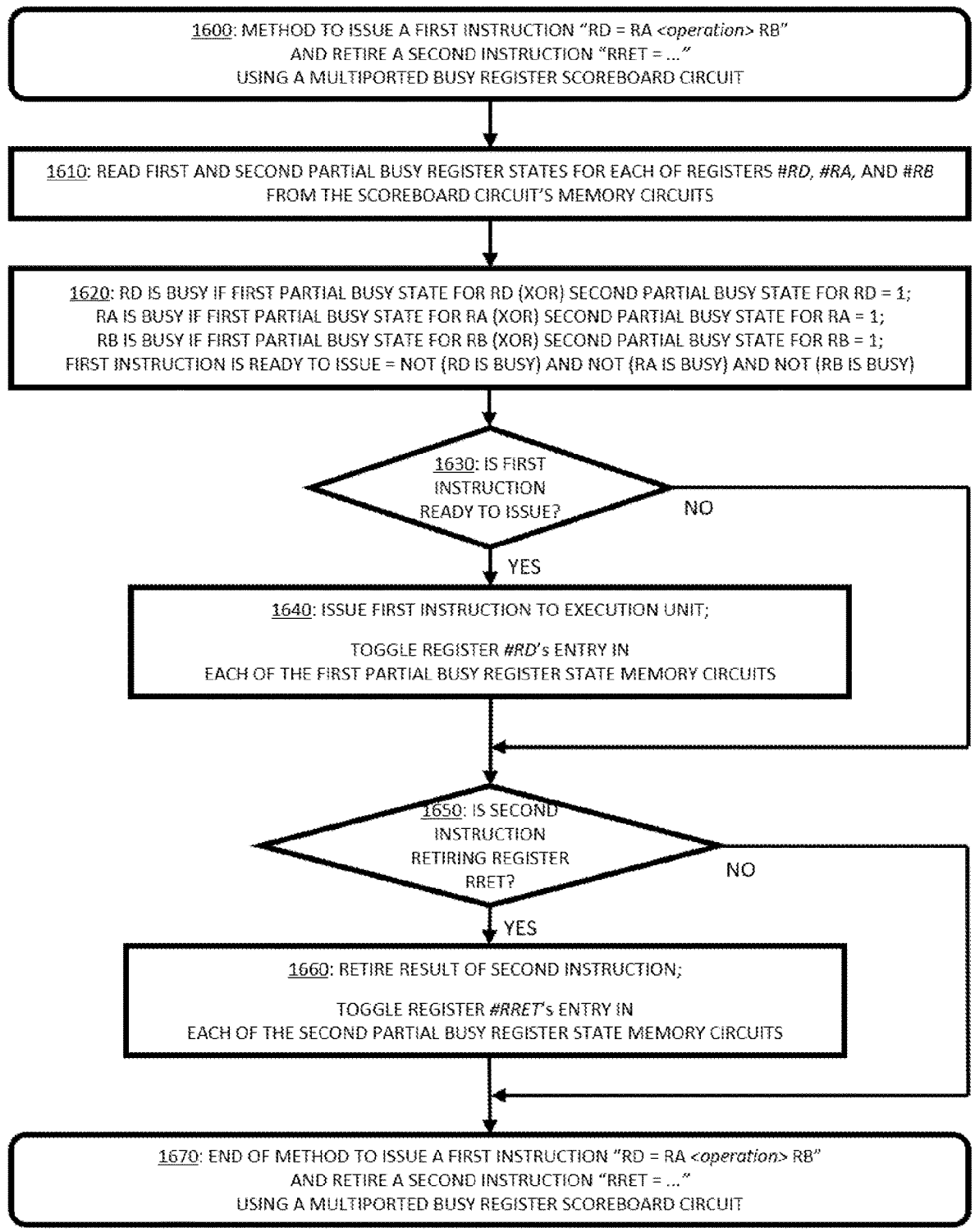
FIG. 16 is a flowchart of a method to issue a first instruction "RD=RA<operation> RB" and to retire a second instruction "RRET= . . . " using a multiported busy-register scoreboard circuit, according to an embodiment.

FIG. 16 is a flowchart of a method to issue a first instruction "RD=RA<operation> RB" and to retire a second instruction "RRET= . . . " in the same clock cycle, using a multiported busy register scoreboard circuit, according to an embodiment. This circuit corresponds to the 3R-2 W busy register scoreboard circuit of FIG. 5A. The first instruction has two source register operands designated by fields RA and RB and a destination register operand designated by RD. The second instruction (e.g., issued earlier in time, now completing with a result) has a destination register designated by RRET. At steps 1610 and 1620, the method determines whether any of the registers RD, RA, or RB are busy in the current clock cycle. At step 1610, the circuit reads the first and second partial busy register states for each of the registers RD, RA, and RB. This involves reading six bits from six scoreboard circuit memory circuits (e.g., the T-RAMS 530, 532, 534, 536, 538, 540). Then, at step 1620, the circuit determines the busy state of registers RD, RA, and RB, by computing the XOR of each pair of their respective first and second partial busy register states read at step 1610. Then if none of RD, RA, or RB are busy, it is safe and correct to issue the first instruction in the current cycle—the first instruction is ready to issue. At step 1630, the circuit tests whether the first instruction is ready to issue; if so, the circuit performs step 1650, otherwise proceeds to step 1650. At step 1640 the processor circuit issues the first instruction to the execution unit. To record that the destination register RD is now busy, the processor circuit toggles (inverts) the entry #RD bit in each of the first (e.g. "ISS_" or "issued") partial busy register memories (e.g. the T-RAMS 532, 536, 540). At step 1650, if there is a second instruction (previously issued) now completing and retiring a result to register RRET, the circuit performs step 1660, otherwise proceeds to step 1670. At step 1670, the processor retires the result of the second (previously issued) instruction, for example updating the register RRET entry in the processor's register file 250. To record that the destination register RRET is now no longer busy, the processor circuit toggles (inverts) the entry #RRET bit in each of the second (e.g. "RET_" or "retired") partial busy register memories (e.g. the T-RAMS 530, 534, 538). Step 1670 is the end of the method. In this method, the processor may have issued a first instruction, but only if the registers the instruction uses are not busy; the processor circuit may have updated the scoreboard to record the destination of the issued instruction is now busy; and it may have updated the scoreboard to record that the destination of the second instruction is no longer busy.

Exemplary Use

In an embodiment, a pipelined RISC processor circuit 110 (FIG. 1) with in-order issue and out-of-order retirement includes a multiported-parity-busy-register scoreboard circuit 130 configured to track the busy state of each register, such that instructions issue one per cycle unless an instruction specifies a source or destination register that is itself busy, i.e., is the destination of a long-latency operation that is still underway.

In an embodiment, the processor circuit 100 is configured to implement, or otherwise according to, the RISC-V RV64I instruction-set architecture. For example, in operation, the processor circuit 100 executes a C program to perform a block copy of 256 8-byte doublewords from a 'from' array to a 'to' array:

```
1      enum { N = 256 };
2      long from[N];
3      long to[N];
4      int main( ) {
5          for (int i = 0; i < N; ++i)
6              from[i] = i;
7          for (int i = 0; i < N; i += 8) {
8              to[i] = from[i];
```

-continued

```
9              to[i+1] = from[i+1];
10             to[i+2] = from[i+2];
11             to[i+3] = from[i+3];
12             to[i+4] = from[i+4];
13             to[i+5] = from[i+5];
14             to[i+6] = from[i+6];
15             to[i+7] = from[i+7];
16         }
17         return 0;
18     }
``` which assembles into this code sequence:

```
1    000000000000008c <main>:
2    ...
3    c4:     00073e03     ld    t3,0(a4)
4    c8:     00873303     ld    t1,8(a4)
5    cc:     01073883     ld    a7,16(a4)
6    d0:     01873803     ld    a6,24(a4)
7    d4:     02073503     ld    a0,32(a4)
8    d8:     02873583     ld    a1,40(a4)
9    dc:     03073603     ld    a2,48(a4)
10   e0:     03873683     ld    a3,56(a4)
11   e4:     01c7b023     sd    t3,0(a5)       # 1000 <__init_start>
12   e8:     0067b423     sd    t1,8(a5)
13   ec:     0117b823     sd    a7,16(a5)
14   f0:     0107bc23     sd    a6,24(a5)
15   f4:     02a7b023     sd    a0,32(a5)
16   f8:     02b7b423     sd    a1,40(a5)
17   fc:     02c7b823     sd    a2,48(a5)
18   100:    02d7bc23     sd    a3,56(a5)
19   104:    04070713     addi  a4,a4,64
20   108:    04078793     addi  a5,a5,64
21   10c:    fbd71ce3     bne   a4,t4,c4       <main+0x38>
22   110:    00000513     li    a0,0
23   114:    00008067     ret
```

The processor circuit 110 is coupled to an uncore circuit 170 including a pipelined data memory DMEM 176 with a latency of 6 cycles. In this embodiment, one iteration of the block copy loop body 00c4-010c exhibits this cycle-by-cycle execution trace:

| time | # | ex:pc | insn | rd | res | |
|------|---|-------|------|-----|-----|---|
| 3818 | 0 | 010c  | bne a4,t4,00c4 | ---- | ----------------- | 0[720]=00000000000000e4  if_pc=00c4 |
| 3820 | 0 | ~0110 | (annul) | ---- | ----------------- | 0[728]=00000000000000e5 |
| 3822 | 0 | 00c4  | ld t3,0(a4) | ---- | ----------------- | 0[730]=00000000000000e6 |
| 3824 | 0 | 00c8  | ld t1,8(a4) | ---- | ----------------- | 0[738]=00000000000000e7  t3? |
| 3826 | 0 | 00cc  | ld a7,16(34) | ---- | ----------------- | t1? t3? |
| 3828 | 0 | 00d0  | ld a6,24(a4) | ---- | ----------------- | t1? a7? t3? |
| 3830 | 0 | 00d4  | ld a0,32(a4) | ---- | ----------------- | t1? a6? a7? t3? |
| 3832 | 0 | 00d8  | ld a1,40(a4) | ---- | ----------------- | t1? a0? a6? a7? t3? |
| 3834 | 0 | 00dc  | ld a2,48(a4) | ---- | ----------------- | 0[f40] t1? a0? a1? a6? a7? t3? |
| 3836 | 0 | 00e0  | ld a3,56(a4) | 0:t3=@00000000000000e8 | 0[f48] t1? a0? a1? a2? a6? a7? t3? t3! |
| 3838 | 0 | 00e4  | sd t3,0(a5) | 0:t1=@00000000000000e9 | 0[f50] t1? a0? a1? a2? a3? a6? a7? t1! |
| time | # | ex:pc | insn | rd | res | |
| 3840 | 0 | 00e8  | sd t1,8(a5) | 0:a7=@00000000000000ea | 0[f58] a0? a1? a2? a3? a6? a7? a7! |
| 3842 | 0 | 00ec  | sd a7,16(a5) | 0:a6=@00000000000000eb | 0[f60] a0? a1? a2? a3? a6? a6! |
| 3844 | 0 | 00f0  | sd a6,24(a5) | 0:a0=@00000000000000ec | 0[f68] a0? a1? a2? a3? a0! |
| 3846 | 0 | 00f4  | sd a0,32(a5) | 0:a1=@00000000000000ed | 0[f70] a1? a2? a3? a1! |
| 3848 | 0 | 00f8  | sd a1,40(a5) | 0:a2=@00000000000000ee | 0[f78] a2? a3? a2! |
| 3850 | 0 | 00fc  | sd a2,48(a5) | 0:a3=@00000000000000ef | 0[740]=00000000000000e8  a3? a3! |
| 3852 | 0 | 0100  | sd a3,56(a5) | ---- | ----------------- | 0[748]=00000000000000e9 |
| 3854 | 0 | 0104  | addi a4,a4,64 | 0:a4=+0000000000001f80 | 0[750]=00000000000000ea |
| 3856 | 0 | 0108  | addi a5,a5,64 | 0:a5=+0000000000001780 | 0[758]=00000000000000eb |
| 3858 | 0 | 010c  | bne a4,t4,00c4 | ---- | ----------------- | 0[760]=00000000000000ec  if_pc=00c4 |
| time | # | ex:pc | insn | rd | res: | |

For example, at a time 3822 in the trace, the processor circuit 100 issues and executes instruction 'ld t3,0(a4)'. As the data memory has a latency of six cycles, the destination register t3 is marked busy in the scoreboard circuit. (This is reflected by the annotation 't3?' that appears at time 3824 in the trace and persists for six (2 ns) clock cycles, until time 3838 in the trace.) In a strictly-in-order processor circuit, the next instruction 'ld t1,8(a4)' could not issue until the prior load completes, but in this case, after consulting the busy-register scoreboard circuit, the instruction scheduler determines that neither the instruction's source register a4 nor its destination register t1 are busy, and so it is safe to issue and execute 'ld t1,8(a4)' at time 3824. As a side effect, by time 3826 both registers t1 and t3 are busy (per the annotation 't1? t3?'). By cycles 3836 and 3836, the busy-register scoreboard circuit tracks six different registers as busy. As the block copy loop has been unrolled to perform eight loads to eight separate registers before performing eight stores of these registers, the block copy loop is able to fully absorb the six-cycle latency of the pipelined-data memory system, so that the total time to issue the eight loads, eight stores, increment the loop counters, and branch back to the top of the loop to start the next iteration, is just 20 cycles. In this example, the busy-register scoreboard circuit enabled concurrent execution of outstanding loads and correct and safe issuance of multiple instructions in the shadow of these long-latency instructions, versus an in-order-retirement cycle count of about 60 cycles, a factor-of-three improvement.

Additional Aspects

In some embodiments a processor exhibiting a composition of microarchitecture design elements may use a scoreboard circuit. In an embodiment, a superpipelined superscalar processor circuit (i.e., a processor circuit that is configured to issue multiple instructions per clock cycle and to issue instructions faster than the latency-register-file—ALU—register file path) includes a scoreboard circuit. In an embodiment, a superpipelined multithreaded processor circuit includes a scoreboard circuit. In an embodiment, a multithreaded superscalar processor circuit includes a scoreboard circuit. In an embodiment, a superpipelined multithreaded superscalar processor circuit includes a scoreboard circuit. In an embodiment, a superpipelined LIW processor circuit includes a scoreboard circuit. In an embodiment, a multithreaded LIW processor circuit includes a scoreboard circuit.

In an embodiment, a processor circuit includes a scoreboard circuit configured to track which function units (circuits) are busy. In an embodiment, a cache memory circuit includes a scoreboard circuit configured to track which cache lines are valid. In an embodiment, a cache memory circuit includes a scoreboard circuit configured to track which cache lines are undergoing miss processing. In an embodiment, a multi-slot mailbox circuit includes a scoreboard circuit configured to track which slots are full. In an embodiment, a scoreboard circuit is configured to track the full/empty status of single-item queues. In an embodiment, a scoreboard circuit is configured to track the full/empty status of single-item queues in one or more memory circuits. In an embodiment, a load/store queue circuit includes a scoreboard circuit configured to tracks queued loads awaiting load results from the memory-circuit hierarchy. In an embodiment, a load/store queue circuit includes a scoreboard circuit configured to tracks queued stores awaiting retirement to memory. In an embodiment, a lock-manager circuit includes a scoreboard circuit configured to tracks the locked/idle status of a set of items.

In an embodiment, a design tool is configured to generate, to configure, or to incorporate a design or a design library to configure an integrated circuit that incorporates a scoreboard circuit. In an embodiment, a design tool is configured to generate, to configure, or to incorporate a design or a design library to configure an FPGA to implement a system that incorporates a scoreboard circuit. In an embodiment, an FPGA bitstream is arranged to configure an FPGA to implement a circuit that includes a scoreboard circuit. In an embodiment, a design tool is configured to generate, to configure, or to incorporate a design or a design library to emit configuration data that, when loaded into an FPGA, causes the FPGA to implement (instantiate) an integrated circuit that incorporates a scoreboard circuit.

Some applications of an embodiment include, without limitation, reusable modular "IP" cores of scoreboard circuits, processor circuits, multiprocessors, and processor-circuit subsystems; composing systems with scoreboard circuits with interface-controller client cores, for various devices, systems, and interfaces, including DRAMs and DRAM DIMMs, in-package 3D die stacked or 2.5D stacked silicon interposer interconnected HBM/WideIO2/HMC DRAMs, SRAMs, FLASH memory, PCI Express, 1G/10G/25G/40G/100G/400G networks, FibreChannel, SATA, and other FPGAs; as a component in parallel-processor-circuit overlay networks; as a component in OpenCL host or memory interconnects; as a component as configured by a SOC builder design tool or IP-core-integration electronic-design-automation tool; use by FPGA electronic-design-automation CAD tools, particularly floor-planning tools and programmable-logic-placement-and-routing tools, use in dynamic partial-reconfiguration systems; and use of the disclosed scoreboard circuit as a component or plurality of components, in computing, datacenters, datacenter application accelerators, high-performance computing systems, machine learning, data management, data compression, deduplication, databases, database accelerators, networking, network switching and routing, network processing, network security, storage systems, telecom, wireless telecom and base stations, video production and routing, embedded systems, embedded vision systems, consumer electronics, entertainment systems, automotive systems, autonomous vehicles, avionics, radar, reflection seismology, medical diagnostic imaging, robotics, complex SOCs, hardware emulation systems, genomics systems, bioinformatics systems, and high-frequency trading systems.

The various embodiments described above can be combined to provide further embodiments. These and other changes can be made to the embodiments considering the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure. Furthermore, it is intended that any embodiment, example, implementation, alternative, or variation, expressly described in, inherent in, or otherwise evident from, this disclosure can be combined with one or more of any other embodiment, example, implementation, alternative, or variation expressly described in, inherent in, or otherwise evident from, this disclosure to generate a resulting structure, method, or system that is within the scope of this disclosure.

The invention claimed is:

1. A scoreboard circuit, comprising:
   a first random-access memory circuit configured to store a first bit for a first item and to invert the first bit in response to a beginning of an operation corresponding to the first item;
   a second random-access memory circuit configured to store a second bit for the first item and to invert the second bit in response to the operation completing; and
   a state-determining circuit configured to determine a state of the first item in response to the exclusive-or function of the first and second bits of the first item, read from the first and second random-access memory circuits, respectively.

2. The scoreboard circuit of claim 1 wherein:
   the first item corresponds to a first register;
   the first random-access memory circuit is configured to store the first bit for the first register and to invert the first bit in response to an issuance of an instruction to write the first register;
   the second random-access memory circuit is configured to store the second bit for the first register and to invert the second bit in response to a completion of the instruction to write the first register; and
   the state-determining circuit is configured to determine a state of the first register in response to the exclusive-or function of the first and second bits for the first register, read from the first and second random-access memory circuits, respectively.

3. The scoreboard circuit of claim 1 wherein the first random-access memory circuit includes one read port and one write port and the second random-access memory circuit includes one read port and one write port.

4. The scoreboard circuit of claim 1 wherein the first random-access memory circuit, the second random-access memory circuit, and the state-determining circuit are implemented in a field-programmable gate array.

5. The scoreboard circuit of claim 1 wherein at least one of the first random-access memory circuit and the second random-access memory circuit is implemented in block RAM memory or lookup-table (LUT) RAM memory or Xilinx SLICEM random-access memory or Intel MLAB random-access memory in a field-programmable gate array.

6. A method, comprising:
   reading a first bit of a first random-access memory circuit at an index corresponding to a first item,
   reading a second bit of a second random-access memory circuit at the index,
   determining the first item is busy in response to the exclusive-or function of the first bit and the second bit, and
   in response to a beginning of a first operation corresponding to the first item, reading a first value of the first bit, and writing to the first random-access memory circuit, at the index, the Boolean negation of the read first value of the first bit, and
   in response to the first operation or another operation completing, reading a first value of the second bit, and writing to the second random-access memory circuit, at the index, the Boolean negation of the read first value of the second bit.

7. The method of claim 6, further comprising:
   wherein the first item corresponds to a register;
   wherein the operation corresponds to executing an instruction that writes the register; and
   in response to completing execution of the instruction that writes the register:
   reading a second value of the second bit from the second random-access memory circuit at the index, and
   writing to the second random-access memory, at the index, the Boolean negation of the read second value of the second bit.

8. An integrated circuit, comprising:
   a processor circuit including registers; and
   a scoreboard circuit, including:
   a first random-access memory circuit configured to store a respective first bit for each of the registers and to invert the respective first bit in response to a commencement of an operation corresponding to a respective one of the registers,
   a second random-access memory circuit configured to store a respective second bit for each of the registers and to invert the respective second bit in response to a completion of the operation; and
   a first-state-determining circuit configured to determine a state of a first one of the registers in response to the exclusive-or function of the first and second bits for the first one of the registers.

9. The integrated circuit of claim 8, wherein the scoreboard circuit further comprises:
   a third random-access memory circuit configured to store a respective third bit for each of the registers and to invert the respective third bit in response to completion of a second operation corresponding to a respective one of the registers; and
   a state-determining circuit configured to determine a state of a second one of the registers in response to the exclusive-or function of the first, second, and third bits for the second one of the registers.

10. The integrated circuit of claim 8, wherein the scoreboard circuit is further configured to indicate the state of a first and a second register and to invert the bits corresponding to a third and a fourth register, all within one clock cycle.

11. The integrated circuit of claim 8, wherein the processor circuit is further configured to:
    execute a sequence of instructions, an instruction of the sequence indicating a source one of the registers and a destination one of the registers; and
    defer issuing the instruction in response to the first-state-determining circuit indicating that the source one of the registers is busy.

12. The integrated circuit of claim 11 wherein the processor circuit is further configured to defer issuing the instruction in response to the first-_state-determining circuit indicating that the destination one of the registers is busy.

13. The integrated circuit of claim 8, wherein the integrated circuit is implemented in a field-programmable gate array.

14. The integrated circuit of claim 8, wherein:
    the operation is an execution of a first instruction identifying one of the registers as a destination register; and
    the processor circuit is configured to:
    invert the first bit or the second bit, respectively, for the destination register of the first instruction in response to issuing or completing the first instruction, and
    not invert any bit within the first random-access memory and the second random-access memory in response to issuing or completing a second instruction.

15. The integrated circuit of claim 8, wherein the processor circuit is configured to issue a first and a second instruction during one clock cycle, each of the first and second instructions indicating a respective one of the registers as a first and second destination register, wherein the scoreboard circuit further includes:
  a third random-access memory circuit configured to store a respective third bit for each of the registers;
  a fourth random-access memory circuit configured to store a respective fourth bit for each of the registers; and
  wherein the first state-determining circuit is configured to determine the state of the first destination register for the first instruction in response to the exclusive-or function of the first, second, third, and fourth bits for the first destination register for the first instruction; and
  wherein the scoreboard circuit:
    in response to issuing the first instruction, is configured to invert the first bit for the first destination register for the first instruction;
    in response to issuing the second instruction, is configured to invert the second bit for the second destination register for the second instruction;
    in response to completing the first instruction, is configured to invert the third bit for the first destination register of the first instruction; and
    in response to completing the second instruction, is configured to invert the fourth bit for the second destination register of the second instruction.

16. The integrated circuit of claim 8, wherein the processor circuit is a hardware-multithreaded processor circuit, the integrated circuit further comprising:
  wherein the registers respectively correspond to registers of a first thread context and of a second thread context;
  wherein the first state-determining circuit is configured to determine the state of a first register of a thread context in response to the exclusive or function of the first bit for the first register corresponding to the first register of the thread context and the second bit for the first register corresponding to the first register of the thread context.

17. A non-transitory machine readable medium storing configuration data that when loaded into a field-programmable gate array, causes the field-programmable gate array to instantiate:
  an integrated circuit, comprising a processor circuit including registers and a including a scoreboard circuit, including
    a first random-access memory circuit configured to store a respective first bit for each of the registers and to invert the respective first bit in response to an operation corresponding to a respective one of the registers commencing;
    a second memory circuit configured to store a respective second bit for each of the registers and to invert the respective second bit in response to the operation completing; and
    a first state-determining circuit configured to determine a state of a first one of the registers in response to the exclusive-or function of the first and second bits for the first one of the registers.

18. A design tool that generates, configures, or incorporates a design file or a design library to configure an integrated circuit comprising:
  a processor circuit including registers; and
  a scoreboard circuit including
    a first random-access memory circuit configured to store a respective first bit for each of the registers and to invert the respective first bit in response to commencing an operation corresponding to a respective one of the registers,
    a second memory circuit configured to store a respective second bit for each of the registers and to invert the respective second bit in response to the operation completing, and
    first state-determining circuit configured to determine a state of a first one of the registers in response to the exclusive-or function of the first and second bits for the first one of the registers.

19. The integrated circuit of claim 8, further including:
  a third random-access memory circuit configured to store a respective third bit for each of the registers and to invert the third bit in response to commencing the operation corresponding to the respective one of the registers;
  a fourth random-access memory circuit configured to store a respective fourth bit for each of the registers and to invert the respective fourth bit in response to the operation completing; and
  a second state-determining circuit configured to determine a state of a second register in response to the exclusive-or function of the third bit for the second register, read from the third random-access memory circuit, and the fourth bit for the second register, read from the fourth random-access memory circuit.

20. The integrated circuit of claim 8, wherein the processor circuit is configured to issue a first and a second instruction, and to complete a third and a fourth instruction, during one clock cycle, each of the first, second, third, and fourth instructions indicating a respective one of the registers as a respective first, second, third, or fourth destination register, wherein the scoreboard circuit:
  further includes
    a third random-access memory circuit configured to store a respective third bit for each of the registers,
    a fourth random-access memory circuit configured to store a respective fourth bit for each of the registers,
    wherein the first state-determining circuit is configured to determine the state of the first destination register in response to the exclusive-or function of the first, second, third, and fourth bits for the first destination register, and
  is configured
    in response to issuing the first instruction, to invert the first bit for the first destination register for the first instruction,
    in response to issuing the second instruction, to invert the second bit for the second destination register for the second instruction,
    in response to completing the third instruction, to invert the third bit for the third destination register of the third instruction, and
    in response to completing the fourth instruction, to invert the fourth bit for the fourth destination register of the fourth instruction.

21. A scoreboard circuit, comprising:
  a first random-access memory circuit configured to store a first bit for a first item and to invert the first bit in response to a beginning of an operation corresponding to the first item;
  a second random-access memory circuit configured to store a second bit for the first item and to invert the second bit in response to the operation completing; and a state-determining circuit configured to determine a state of the first item in response to the exclusive-nor function of the first and second bits of the first item, read from the first and second random-access memory circuits, respectively.

\* \* \* \* \*